United States Patent [19]
Shirai

[11] Patent Number: 6,021,082
[45] Date of Patent: Feb. 1, 2000

[54] SEMICONDUCTOR MEMORY DEVICE INCLUDING AN INTERNAL POWER SUPPLY CIRCUIT HAVING STANDBY AND ACTIVATION MODE

[75] Inventor: Yutaka Shirai, Yokohama, Japan

[73] Assignee: Kabushiki Kaisha Toshiba, Kawasaki, Japan

[21] Appl. No.: 09/204,783

[22] Filed: Dec. 3, 1998

[30] Foreign Application Priority Data

Dec. 5, 1997  [JP]  Japan .................................. 9-335876

[51] Int. Cl.[7] ...................................................... G11C 7/00
[52] U.S. Cl. .......................................... 365/226; 365/229
[58] Field of Search .............................. 365/230.03, 226, 365/194, 229, 203

[56] References Cited

U.S. PATENT DOCUMENTS

| | | | |
|---|---|---|---|
| 5,442,588 | 8/1995 | Runas ........................................ 365/222 |
| 5,715,203 | 2/1998 | Uchida ...................................... 365/203 |
| 5,815,456 | 9/1998 | Rao ....................................... 365/230.03 |

*Primary Examiner*—David Nelms
*Assistant Examiner*—Thong Le
*Attorney, Agent, or Firm*—Loeb & Loeb, LLP

[57] ABSTRACT

An internal power supply voltage generation circuit used for a semiconductor memory device is disclosed. The semiconductor integrated circuit device includes a memory unit for storing data, and an internal power supply voltage generation unit for generating an internal power supply voltage VINT from an external power supply voltage VCC. The internal power supply voltage generation unit has a standby internal power supply voltage generation circuit and an activation internal power supply voltage generation circuit. The activation internal power supply voltage generation circuit is controlled by a control circuit. When a plurality of banks are set in the memory unit, the control circuit activates the activation internal power supply voltage generation circuit while at least one bank is active.

20 Claims, 15 Drawing Sheets

SEMICONDUCTOR MEMORY DEVICE INCLUDING AN INTERNAL POWER SUPPLY CIRCUIT HAVING STANDBY AND ACTIVATION MODE

BACKGROUND OF THE INVENTION

The present invention relates to a semiconductor memory device and, more particularly, to an internal power supply circuit for generating an internal power supply voltage in a DRAM.

Recently in the field of semiconductor memories represented by the DRAM, the memory capacity increases, and transistors integrated on a chip are miniaturized.

Since the electrical breakdown voltage of a small transistor is low, an external power supply voltage VCC is stepped down by an internal power supply voltage generation circuit arranged on the chip to generate an internal power supply voltage VINT, and the internal power supply voltage VINT drives an integrated circuit formed on the chip.

A conventional internal power supply voltage generation circuit is constituted by a large-size N-channel MOSFET (NMOS). That is, the external power supply voltage VCC is supplied to the drain of this NMOS to obtain the internal power supply voltage VINT from its source.

A voltage generation circuit of this type can advantageously increase a load current. Even when a DRAM chip becomes active, and the integrated circuit formed on the chip consumes a large amount of internal power supply voltage VINT, a sufficient internal power supply voltage VINT can be supplied in accordance with the consumption.

The voltage generation circuit using an NMOS can advantageously increase a load current, but the load current is difficult to decrease. That is, even when the DRAM chip changes to a standby state, and the internal integrated circuit hardly consumes the internal power supply voltage VINT, the NMOS of the voltage generation circuit continuously flows a current from the external power supply VCC to the internal power supply VINT.

In the DRAM on which this voltage generation circuit is mounted, the consumption amount of external power supply voltage VCC is difficult to reduce, which makes it difficult to further reduce power consumption.

The consumption amount of external power supply voltage VCC can be reduced by turning "off" the NMOS of the voltage generation circuit when the chip changes to, e.g., a standby state.

However, the NMOS of the voltage generation circuit has a large size, charging/discharging the gate requires a long time, and the NMOS cannot be turned "on/off" at high speeds. In practice, of semiconductor memory devices, a DRAM, particularly a synchronous DRAM demanded for high-speed operation is always kept "on" regardless of the active/standby state of the chip.

BRIEF SUMMARY OF THE INVENTION

The present invention has been made in consideration of the above situation, and has as its object to provide a semiconductor integrated circuit device having an internal power supply voltage generation circuit capable of reducing the consumption amount of external power supply voltage VCC and coping with a device which is internally divided into a plurality of banks.

According to the present invention, there is provided a semiconductor memory device comprising:

a memory portion for storing data, the memory portion divided into a plurality of banks;

a internal power supply voltage generator for generating an internal power supply voltage supplied to the memory portion from an external power supply voltage, the generator including a standby internal power supply circuit and an activation internal power supply circuit; and a controller for controlling the internal power supply voltage generator, the controller including a control circuit for activates the activation internal power supply circuit during at least one bank is active.

In the present invention, an internal power supply voltage generation unit includes a standby internal power supply circuit and an activation internal power supply circuit. Decreasing, e.g., a bias current in the standby internal power supply circuit can reduce the consumption amount of external power supply voltage in a standby state.

A control unit for controlling the internal power supply voltage generation unit includes a control circuit for controlling the activation internal power supply circuit. When a plurality of banks are set in the memory unit, the control circuit activates the activation internal power supply circuit while at least one bank is active. This control circuit allows to cope with a device in which the memory unit is divided into a plurality of banks.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described below with reference to the several views of the accompanying drawing.

Figure 1:
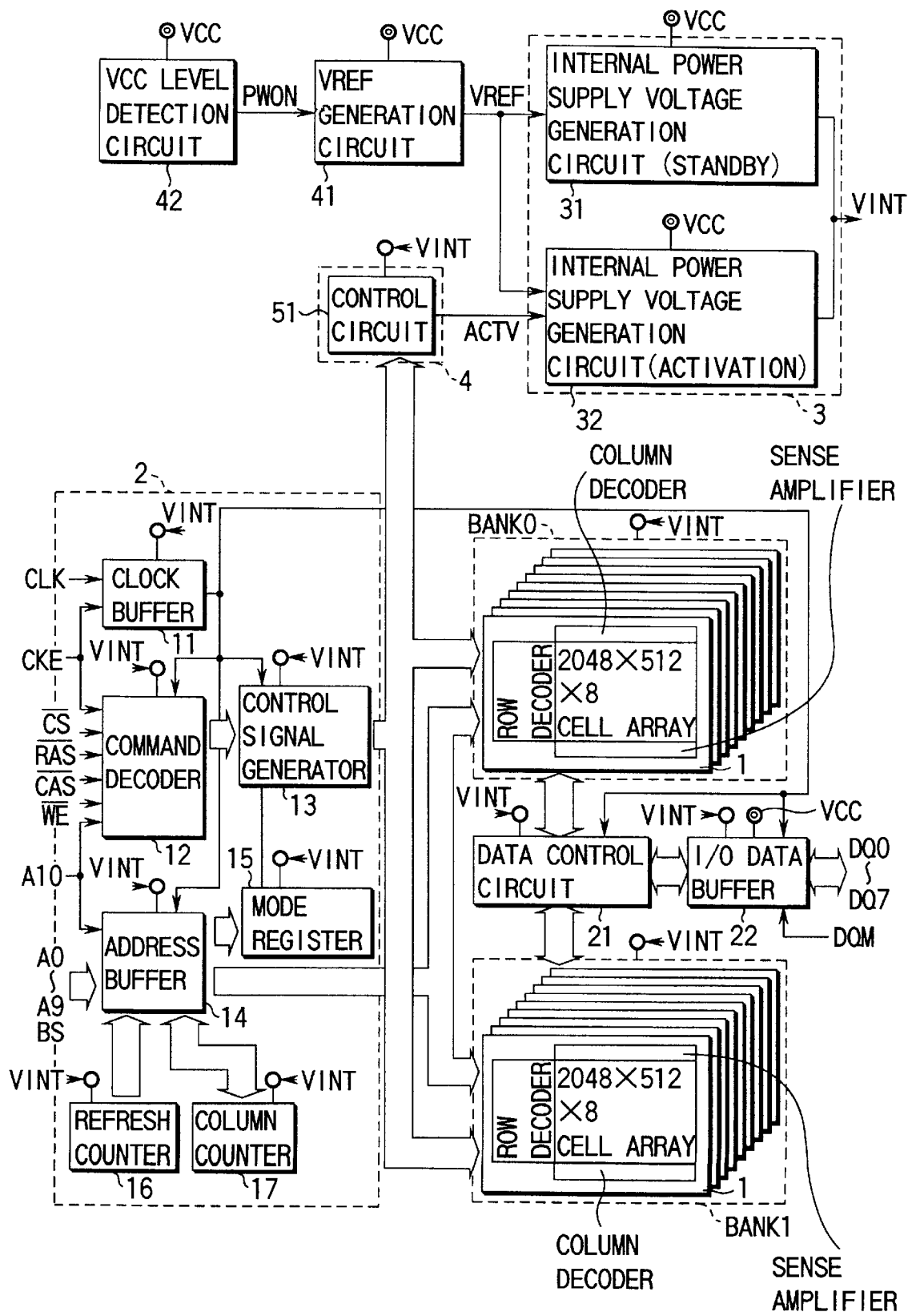
FIG. 1 is a block diagram showing the basic arrangement of a synchronous DRAM according to an embodiment of the present invention.

FIG. 1 is a block diagram showing the basic arrangement of a synchronous DRAM according to an embodiment of the present invention.

As an embodiment, FIG. 1 exemplifies a synchronous DRAM having a memory capacity of 16 Mbits. This synchronous DRAM serving as a core circuit of a memory comprises a cell array prepared by laying out dynamic memory cells in a matrix, a row decoder for selecting a row of the cell array, a column decoder for selecting a column of the cell array, and a sense amplifier for amplifying/latching data read out from the cell array and write data to the cell array.

In FIG. 1, the 16-Mbit memory capacity is divided into 16 (2,048×512×16) by addresses, and an arrangement equivalent to a memory system having 16 1-Mbit DRAMs is realized on one chip. A portion corresponding to a 1-Mbit DRAM obtained on the chip upon 16 division is referred to as a 1 M-bit memory unit 1 in this specification.

The 16 1-Mbit memory units 1 are divided into a plurality of banks, e.g., two banks (BANK0 and BANK1) each including eight memory units in the example shown in FIG. 1. Each of the two banks outputs ×8-bit data (DQ0 to DQ7) at once.

A plurality of banks set on one chip can independently operate (interleave bank activating operation) such that BANK0 is in an active state while BANK1 is in a standby state.

Each of the 16 1-Mbit memory units 1 divided into the two banks is controlled by a control unit 2.

The control unit 2 is constituted by a clock buffer 11 for receiving an external clock CLK, a command decoder 12 for decoding a command designated by the logic levels of signals such as a chip select signal /CS, a row address strobe signal /RAS, a column address strobe signal /CAS, and a write enable signal /WE, a control signal generator 13 for generating an internal control signal from the command decoded by the command decoder 12, an address buffer 14 for receiving address signals A0 to A10 and a bank select signal BS into the chip, a mode register 15 for storing a setting mode such as burst length and CAS latency, a refresh counter 16, a column counter 17, and the like.

Data from the 16 1-Mbit memory units 1 divided into the two banks are read out/written via a data control circuit 21 and an I/O data buffer 22.

These circuits are operated by an internal power supply voltage VINT. The internal power supply voltage VINT is generated by an internal power supply voltage generation unit 3 arranged on the same chip. Note that an output stage (not shown) arranged inside the I/O data buffer 22 may be driven by an external power supply voltage VCC.

The internal power supply voltage generation unit 3 is constituted by two internal power supply voltage generation (step-down) circuits. One is a standby voltage generation (step-down) circuit 31, and the other is an activation voltage generation (step-down) circuit 32.

The standby voltage generation circuit 31 always operates after the chip is powered on, and continuously generates the internal power supply voltage VINT while power is ON.

If a reference voltage VREF is generated, the standby voltage generation circuit 31 shown in FIG. 1 steps down the external power supply voltage VCC to generate the internal power supply voltage VINT. The reference voltage VREF is generated by a VREF generation circuit 41. A VCC level detection circuit 42 detects whether power is ON. If the level of the external power supply voltage VCC exceeds a predetermined value, the VCC level detection circuit 42 detects that power is ON, and outputs a power-on detection signal PWON. While the power-on detection signal PWON represents a power-on state, the VREF generation circuit 41 continuously generates the reference voltage VREF. Therefore, the standby voltage generation circuit 31 continuously generates the internal power supply voltage VINT while power is ON.

The standby voltage generation circuit 31 requires a small driving current and a bias current as small as several μA. This suppresses consumption of the external power supply voltage VCC in a standby state.

Figure 2:
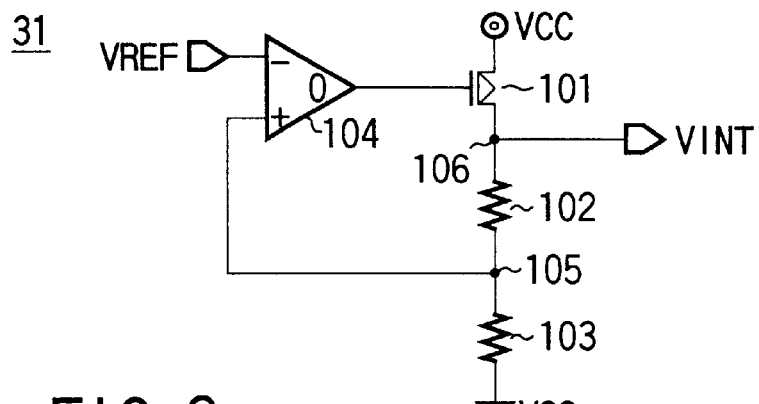
FIG. 2 is a circuit diagram showing a circuit example of a standby voltage generation circuit.

FIG. 2 is a circuit diagram showing a circuit example of the standby voltage generation circuit 31.

As shown in FIG. 2, the standby voltage generation circuit 31 comprises a PMOS 101 whose source receives the external power supply voltage VCC, resistors 102 and 103 series-connected between the drain of the PMOS 101 and a ground point VSS within the circuit, and an operational amplifier 104.

The gate of the PMOS 101 receives an output (O) from the operational amplifier 104. The negative input (−) of the operational amplifier 104 receives the reference voltage VREF, and the positive input (+) receives a voltage at a connection node 105 between the resistors 102 and 103. The resistance ratio of the resistors 102 and 103 is adjusted to change the internal power supply voltage VINT to a set value when the potential of the reference voltage VREF becomes equal to the potential of the connection node 105. The internal power supply voltage VINT is obtained from a connection node 106 between the drain of the PMOS 101 and the resistor 102.

When the voltage of the negative input (−) is higher than the voltage of the positive input (+), the operational amplifier 104 decreases its output level in accordance with the potential difference to turn "on" the PMOS 101 and raise the voltage of the connection node 105.

When the voltage of the negative input (−) is lower than the voltage of the positive input (+), the operational amplifier 104 raises its output level in accordance with the potential difference to turn "off" the PMOS 101 and decrease the voltage of the connection node 105.

While power is ON, the standby voltage generation circuit 31 keeps the voltage of the connection node 106 at a constant value and generates a constant internal power supply voltage VINT under this feedback control.

The activation voltage generation circuit 32 requires a large driving current and a bias current as large as several μA to several mA. The activation voltage generation circuit 32 operates when the chip changes to an active state, and generates the internal power supply voltage VINT only while the chip is in an active state. The activation voltage generation circuit 32 shown in FIG. 1 has a voltage generation circuit control unit 4.

The voltage generation circuit control unit 4 has a control circuit 51 for controlling the voltage generation circuit. The control circuit 51 outputs a voltage generation circuit activation signal ACTV upon reception of a control signal from the control signal generator 13.

Figure 3:
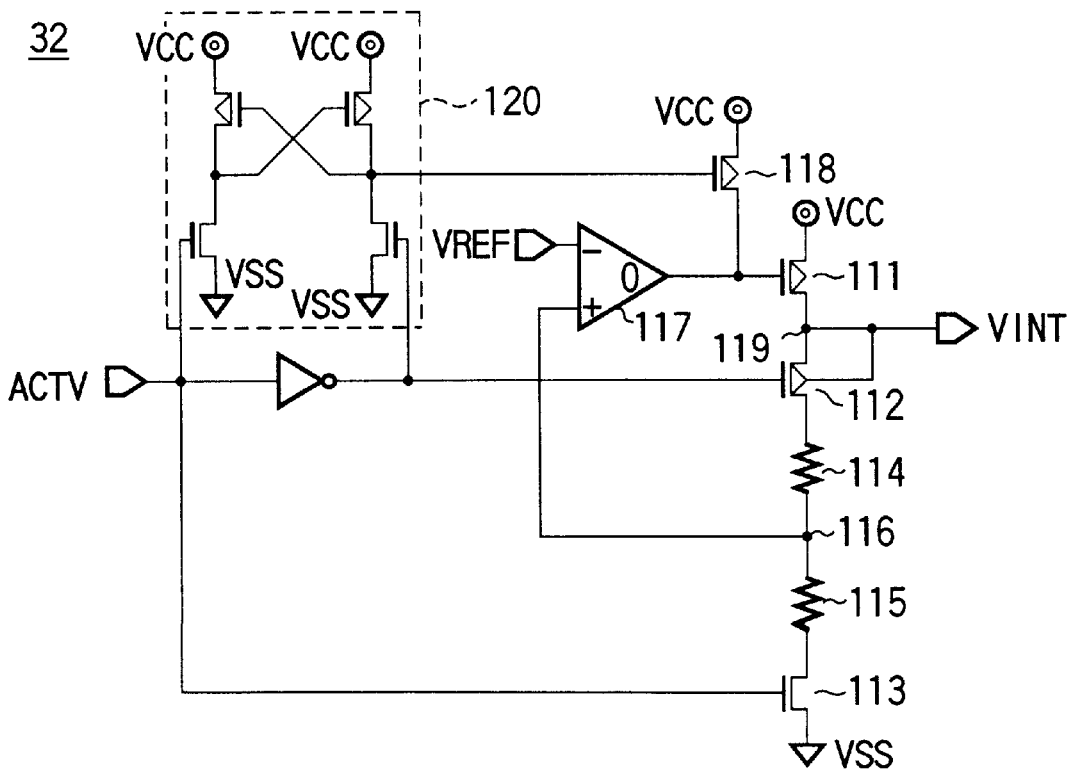
FIG. 3 is a circuit diagram showing a circuit example of an activation voltage generation circuit.

FIG. 3 is a circuit diagram showing a circuit example of the activation voltage generation circuit 32.

As shown in FIG. 3, the activation voltage generation circuit 32 comprises a PMOS 111 whose source receives the external power supply voltage VCC, a PMOS 112 whose source is connected to the drain of the PMOS 111, an NMOS 113 whose source receives the ground potential VSS within the circuit, resistors 114 and 115 series-connected between the drains of the PMOS 112 and NMOS 113, an operational amplifier 117 having an output (O) connected to the gate of the PMOS 111, a positive input (+) connected to a connection node 116 between the resistors 114 and 115, and a negative input (−) receiving the reference voltage VREF, and a PMOS 118 series-connected between the gate of the PMOS 111 and the external power supply VCC. The resistance ratio of the resistors 114 and 115 is the same as the resistance ratio of the resistors 102 and 103 shown in FIG. 2, and is adjusted to change the internal power supply voltage VINT to a set value when the potential of the reference voltage VREF becomes equal to the potential of the connection node 116.

When the activation signal ACTV rises to "H" level, the PMOS 112 and NMOS 113 are turned "on", and the PMOS 118 is turned "off". The PMOS 111 is controlled by an output from the operational amplifier 117, and the activation voltage generation circuit 32 is activated to generate the internal power supply voltage VINT.

When the voltage of the positive input (+) is lower than the reference voltage VREF, the operational amplifier 117 decreases its output level in accordance with the potential difference to turn "on" the PMOS 111 and raise the voltage of the connection node 116.

When the voltage of the positive input (+) is higher than the reference voltage, the operational amplifier 117 increases its output level in accordance with the potential difference to turn "off" the PMOS 111 and decrease the voltage of the connection node 116.

This feedback control keeps the voltage of a connection node 119 between the drain of the PMOS 111 and the source of the PMOS 112, i.e., the internal power supply voltage VINT constant.

A circuit 120 is a level shift circuit for shifting the "H" level of the activation signal ACTV from the level of the internal power supply voltage VINT to the level of the external power supply voltage VCC.

When the activation signal ACTV falls to "L" level, the PMOS 112 and NMOS 113 are turned "off", and the PMOS 118 is turned "on". The PMOS 111 is turned "off" to inactivate the activation voltage generation circuit 32.

By mounting the standby voltage generation circuit 31 and activation voltage generation circuit 32 on one chip, the chip can suppress an increase in power consumption in a standby state. Even for a stricter specification of the power consumption in a standby state, the arrangement sufficiently satisfies the specification more easily than a conventional voltage generation circuit using an NMOS. In an active state, the internal power supply voltage VINT can be reliably ensured like the conventional voltage generation circuit using an NMOS.

In a general-purpose DRAM, the signal ACTV for controlling the start/stop of the activation voltage generation circuit 32 is synchronized with, e.g., a signal RINT. The signal RINT is a signal in synchronism with the row address strobe signal /RAS, and is generally an output from a RAS buffer. For example, the signal RINT is kept at "H" level after the signal /RAS falls and before the word line is activated, data is rewritten (refreshed) in a dynamic memory cell, in some cases data is read out or written, and precharging is started by raising the signal /RAS.

That is, in the general-purpose DRAM, the signal ACTV is only synchronized with a signal representing the active state of the array, e.g., signal /RAS.

To the contrary, in a synchronous DRAM, simply synchronizing the signal ACTV with the signal /RAS causes operational problems. This is because the signal /RAS does not represent the active state of the array in the synchronous DRAM.

As shown in FIG. 1, the synchronous DRAM employs many banks. Particularly in interleave bank activating operation, while a given bank is activated to rewrite a series of data, another bank is activated. If the signal ACTV is synchronized with the signal /RAS, the activation voltage generation circuit 32 contradictorily stops operating even while another bank is activated.

This embodiment therefore adopts the internal power supply voltage control unit 4 including the control circuit 51 for controlling the start/stop of the activation voltage generation circuit 32 so as to cope with the synchronous DRAM.

Several circuit examples of the control circuit 51 will be sequentially described.

[First Circuit Example]

Figure 4:
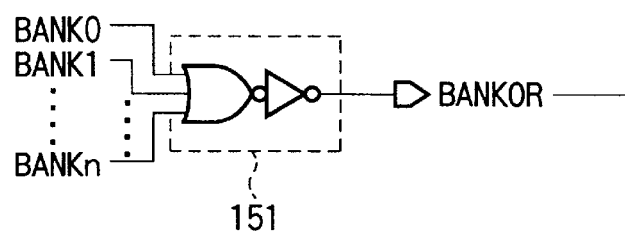
FIG. 4 is a circuit diagram showing the first circuit example of a control circuit.
Figure 4:
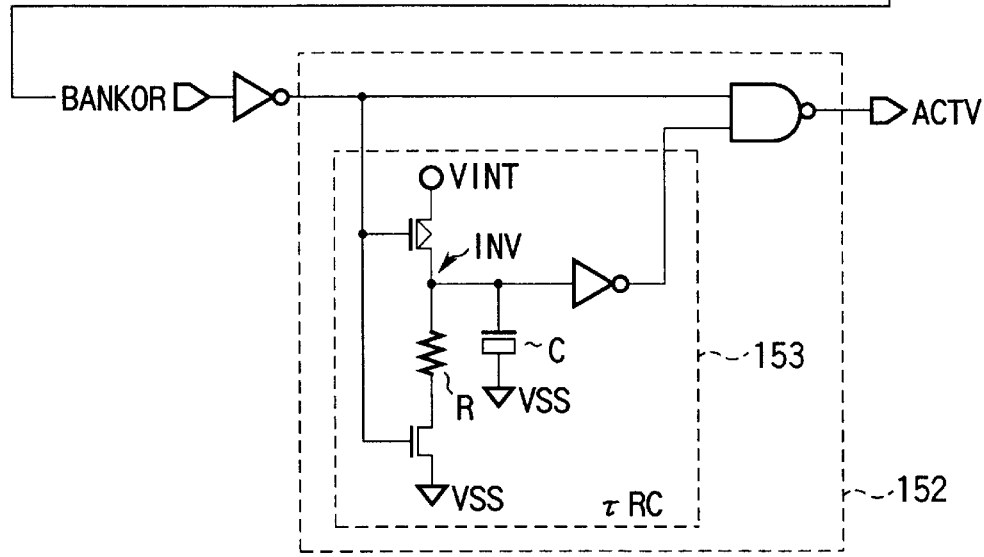

FIG. 4 is a circuit diagram showing the first circuit example of the control circuit 51.

As shown in FIG. 4, the control circuit 51 ORs bank activation signals BANK0 to BANKn to generate a signal BANKOR in order to operate the activation voltage generation circuit 32 when the chip changes to an active state.

The bank activation signal BANK0 is at "H" level while bank 0 is active, the bank activation signal BANK1 is at "H" level while bank 1 is active, the bank activation signal BANKn is at "H" level while bank n is active.

Since the synchronous DRAM shown in FIG. 1 has two banks, the bank activation signals are only two BANK0 and BANK1.

If even one of the bank activation signals BANK0 to BANKn is at "H" level upon ORing these signals, the signal BANKOR rises to "H" level. In FIG. 4, a circuit 151 generates the signal BANKOR.

This signal BANKOR is used as the signal ACTV. If even one of the banks within the chip is in an active state, the activation voltage generation circuit 32 operates to generate the internal power supply voltage VINT.

As described above, the signal BANKOR can be directly used as the signal ACTV. In this embodiment, however, the timing at which the signal ACTV falls from "H" level to "L" level is set at time with a delay time required to completely change the chip to a standby state after all the bank activation signals BANK0 to BANKn change to "L" level.

For example, in the synchronous DRAM shown in FIG. 1, the signal ACTV falls from "H" level to "L" level with a delay time required to completely change the 1-Mbit memory unit 1 to a precharge state after the bank activation signal BANKn falls from "H" level to "L" level and the signal BANKOR falls from "H" level to "L" level upon reception of a command for shifting the 1-Mbit memory unit 1 from an active state to a precharge state. In FIG. 4, a circuit 152 is a delay circuit for determining the delay time.

When the signal BANKOR rises from "L" level to "H" level, the delay circuit 152 does not substantially delay the signal ACTV and raises it from "L" level to "H" level.

When the signal BANKOR falls from "H" level to "L" level, the delay circuit 152 delays the signal ACTV by a delay time τRC of a delay stage, i.e., a timer 153 arranged on the delay circuit 152, and then changes the signal ACTV from "H" level to "L" level.

The timer 153 is constituted by a resistor R arranged inside, e.g., a CMOS inverter INV, and a capacitor C. The delay time τRC is substantially determined by the resistor R and capacitor C. The delay time τRC is almost equal to or longer than a time required to complete precharging of the 1-Mbit memory unit 1 after the start of precharging.

With this arrangement, while the 1-Mbit memory unit 1 completely shifts from an active state to a precharge state, the activation voltage generation circuit 32 does not stop, and, e.g., a lack of the internal power supply voltage VINT can be avoided. Unexpected malfunction caused by a lack of the internal power supply voltage VINT can be prevented.

[Second Circuit Example]

The second circuit example of the control circuit 51 will be described.

The synchronous DRAM is permitted to enter a power-down mode from a bank active state. The upper limit of the current consumption during the power-down mode is determined to several mA.

If, however, the activation voltage generation circuit 32 requiring a large bias current continuously operates during the power-down mode, when the size of the activation voltage generation circuit 32 increases to increase its current consumption or the specification becomes stricter, only the current consumption of the voltage generation circuit 32 may exceed the upper limit of several mA.

The second circuit example copes with this situation.

Figure 5:
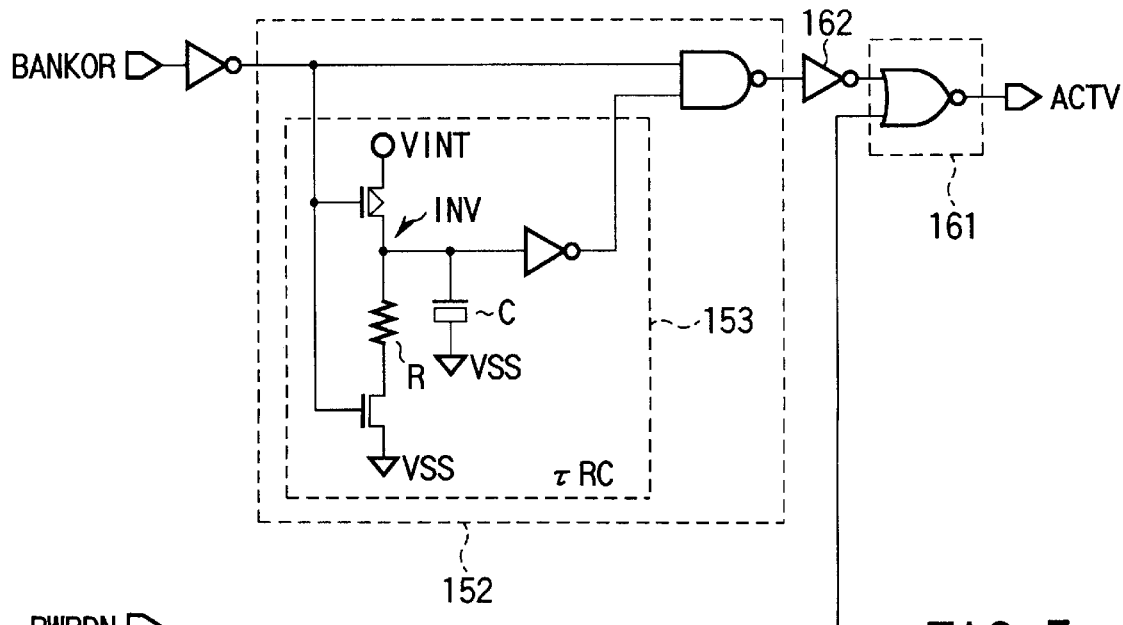
FIG. 5 is a circuit diagram showing the second circuit example of the control circuit.

FIG. 5 is a circuit diagram showing the second circuit example of the control circuit 51.

As shown in FIG. 5, a switching circuit 161 is arranged at the output of the delay circuit 152. The switching circuit 161 in this example is constituted by a NOR circuit. The first input of the NOR circuit receives a signal obtained by inverting an output signal from the delay circuit 152 by an inverter 162. The second input receives a signal PWRDN representing the power-down mode. The signal PWRDN is at "H" level during the power-down mode, and at "L" level during remaining modes.

The NOR circuit constituting the switching circuit 161 is active at "L" level. Accordingly, when the signal PWRDN is at "L" level, the NOR circuit constituting the switching circuit 161 functions as an inverter.

In the remaining modes except for the power-down mode, the switching circuit 161 changes the logic level of the signal ACTV in accordance with the output level of the delay circuit 152.

In the power-down mode, the switching circuit 161 fixes the logic level of the signal ACTV to "L" level regardless of the output level of the delay circuit 152, and stops operation of the activation voltage generation circuit 32.

In the second circuit example, since the logic level of the signal ACTV can be fixed to "L" level in the power-down mode regardless of the output level of the delay circuit 152, operation of the activation voltage generation circuit 32 can be stopped in the power-down mode. This suppresses the current consumption during the power-down mode.

[Third Circuit Example]

The third circuit example can cope with the power-down mode, like the second circuit example.

Figure 6:
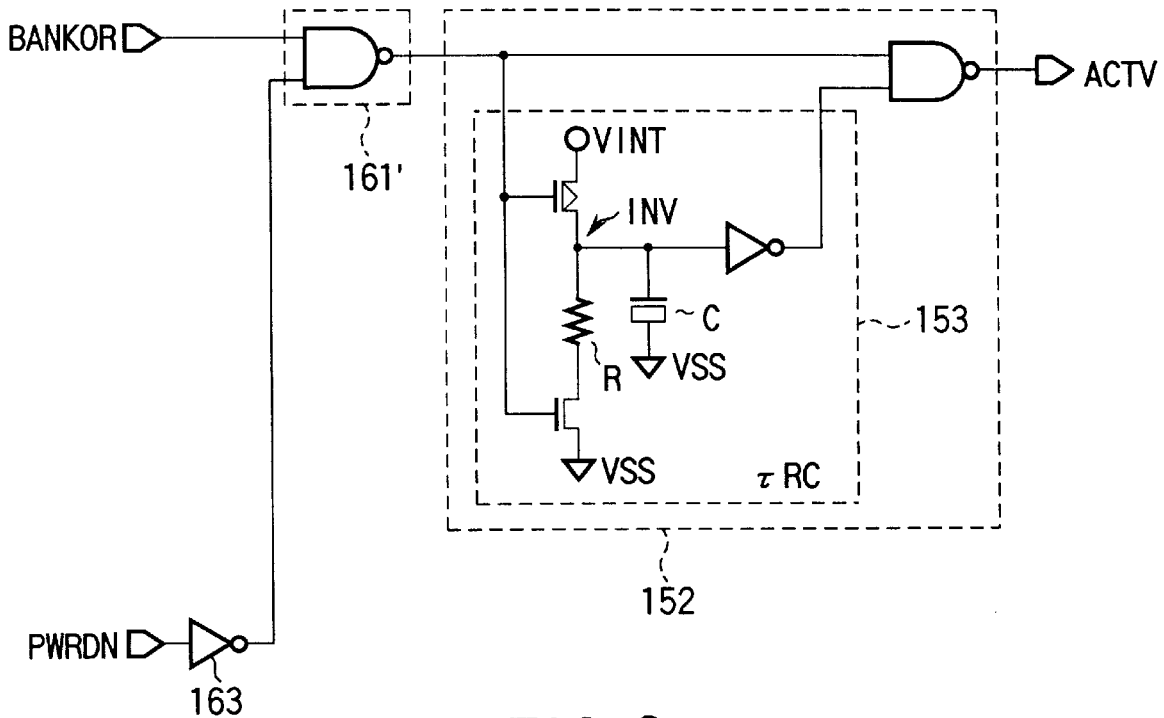
FIG. 6 is a circuit diagram showing the third circuit example of the control circuit.

FIG. 6 is a circuit diagram showing the third circuit example of the control circuit 51.

As shown in FIG. 6, the third circuit example is different from the second circuit example in that a switching circuit 161' for fixing the logic level of the signal ACTV to "L" level in the power-down mode regardless of the logic level of the signal BANKOR is arranged at the input of the delay circuit 152.

The switching circuit 161' in the third circuit example is constituted by a NAND circuit. The first input of the NAND circuit receives the signal BANKOR, and the second input receives a signal obtained by inverting the signal PWRDN representing the power-down mode by an inverter 163.

The NAND circuit constituting the switching circuit 161' is active at "H" level. Accordingly, when the signal PWRDN is at "L" level, the NAND circuit constituting the switching circuit 161' functions as an inverter.

In remaining modes except for the power-down mode, the switching circuit 161' changes the logic level of its output in accordance with a change in logic level of the signal BANKOR, and inputs the resultant output to the delay circuit 152. The logic level of the signal ACTV output from the delay circuit 152 is changed in accordance with the logic level of the signal BANKOR.

In the power-down mode, the switching circuit 161' fixes its logic level to "H" level regardless of the logic level of the signal BANKOR, and inputs the resultant output to the delay circuit 152.

Then, the logic level of the signal ACTV output from the delay circuit 152 is fixed to "L" level regardless of the logic level of the signal BANKOR.

Similar to the second circuit example, operation of the activation voltage generation circuit 32 can be stopped in the power-down mode to suppress the current consumption during the power-down mode.

Further, the third circuit example can advantageously delay by the delay time τRC the timing of the signal ACTV at which it falls from "H" level to "L" level in the power-down mode.

[Fourth Circuit Example]

The fourth circuit example of the control circuit 51 will be explained.

The synchronous DRAM is permitted to output burst data up to one clock cycle for a clock latency of "2" (CL=2) after the start of precharging, two clock cycles for a clock latency of "3" (CL=3), and three clock cycles for a clock latency of "4" (CL=4).

When one clock cycle has a maximum value of 1 μsec for "CL=4", the synchronous DRAM can also be permitted to output new data up to 2 μsec or more after the start of precharging.

However, only by control of detecting the completion of precharging by the timer 153 using the resistor R and capacitor C and stopping operation of the activation voltage generation circuit 32, operation of the activation voltage generation circuit 32 may stop during output of burst data performed even upon the completion of precharging, thereby failing to supply the internal power supply voltage VINT enough to operate the data output system.

The fourth circuit example can cope with this situation.

Figure 7:
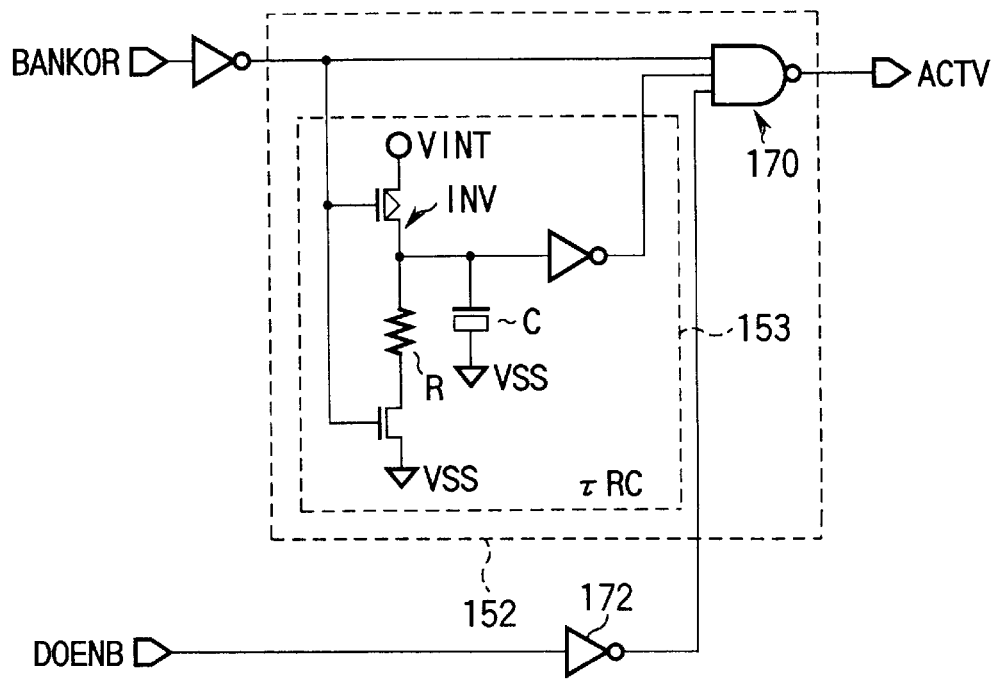
FIG. 7 is a circuit diagram showing the fourth circuit example of the control circuit.

FIG. 7 is a circuit diagram showing the fourth circuit example of the control circuit 51.

As shown in FIG. 7, the third input of a NAND circuit constituting an output stage 170 of the delay circuit 152 receives a signal obtained by inverting a signal DOENB for enabling output of data by an inverter 172. The signal DOENB is at "H" level when data is output, and at "L" level when no data is output.

The NAND circuit constituting the output stage 170 is active at "H" level. When the signal DOENB is at "L" level, the NAND circuit constituting the output stage 170 functions as a 2-input NAND circuit.

When no data is output, the output stage 170 changes the logic level of the signal ACTV in accordance with the logic level of the signal BANKOR.

When data is output, the output stage 170 fixes the logic level of the signal ACTV to "H" level regardless of the logic level of the signal BANKOR to continuously operate the activation voltage generation circuit 32.

In the fourth circuit example, since the logic level of the signal ACTV can be fixed to "H" level during output of data regardless of the logic level of the signal BANKOR, the activation voltage generation circuit 32 can be continuously operated during output of data. Therefore, a lack of the internal power supply voltage VINT during output of data can be avoided.

[Fifth Circuit Example]

The fifth circuit example can continuously operate the activation voltage generation circuit 32 during output of data, similar to the fourth embodiment.

Figure 8:
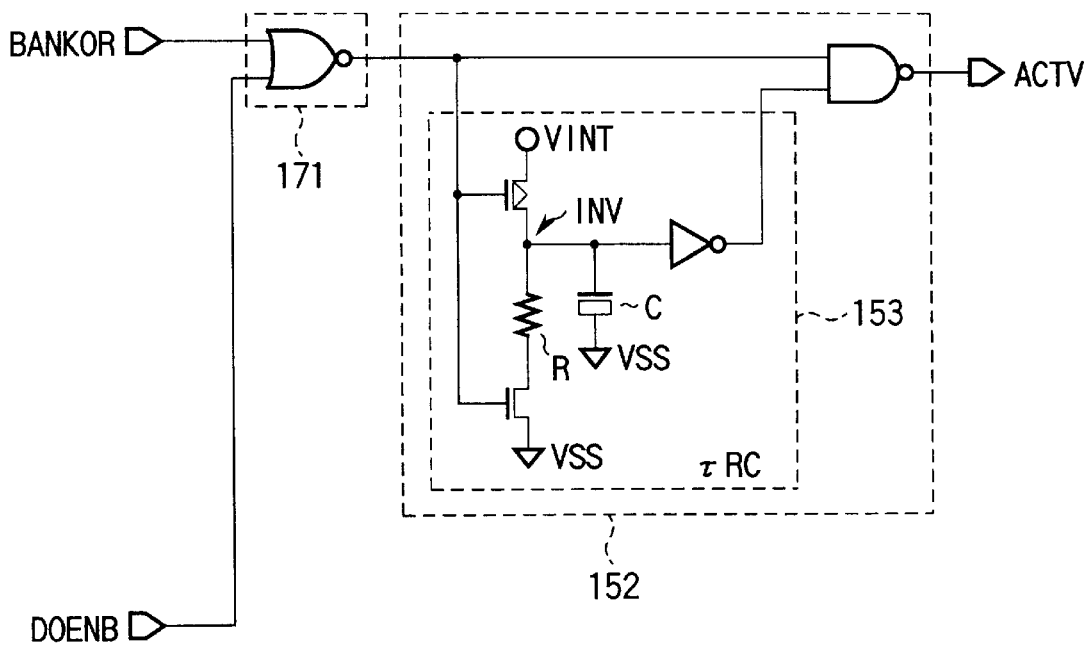
FIG. 8 is a circuit diagram showing the fifth circuit example of the control circuit.

FIG. 8 is a circuit diagram showing the fifth circuit example of the control circuit 51.

As shown in FIG. 8, the fifth circuit example is different from the fourth circuit example in that a switching circuit 171 for fixing the logic level of the signal ACTV to "H" level during output of data regardless of the logic level of the signal BANKOR is arranged at the input of the delay circuit 152.

The switching circuit 171 in the fifth circuit example is constituted by a NOR circuit. The first input of the NOR circuit receives the signal BANKOR, and the second input receives the signal DOENB representing output of data.

The NOR circuit constituting the switching circuit 171 is active at "L" level. When the signal DOENB is at "L" level, the NOR circuit constituting the switching circuit 171 functions as an inverter.

When no data is output, the switching circuit 171 changes the logic level of its output in accordance with a change in logic level of the signal BANKOR, and supplies the resultant output to the delay circuit 152. As a result, the logic level of the signal ACTV output from the delay circuit 152 is changed in accordance with the logic level of the signal BANKOR.

When data is output, the switching circuit 171 fixes its logic level to "L" level regardless of the logic level of the signal BANKOR, and supplies the resultant output to the delay circuit 152. The logic level of the signal ACTV output from the delay circuit 152 is fixed to "H" level regardless of the logic level of the signal BANKOR.

Like the fourth circuit example, the activation voltage generation circuit 32 can be continuously operated during output of data regardless of the logic level of the signal BANKOR to avoid a lack of the internal power supply voltage VINT during output of data.

The fifth circuit example can advantageously delay by the delay time τRC the timing of the signal ACTV at which it falls from "H" level to "L" level after data is output.

[Sixth Circuit Example]

The sixth circuit example can cope with the power-down mode and can continuously operate the activation voltage generation circuit 32 during output of data.

Figure 9:
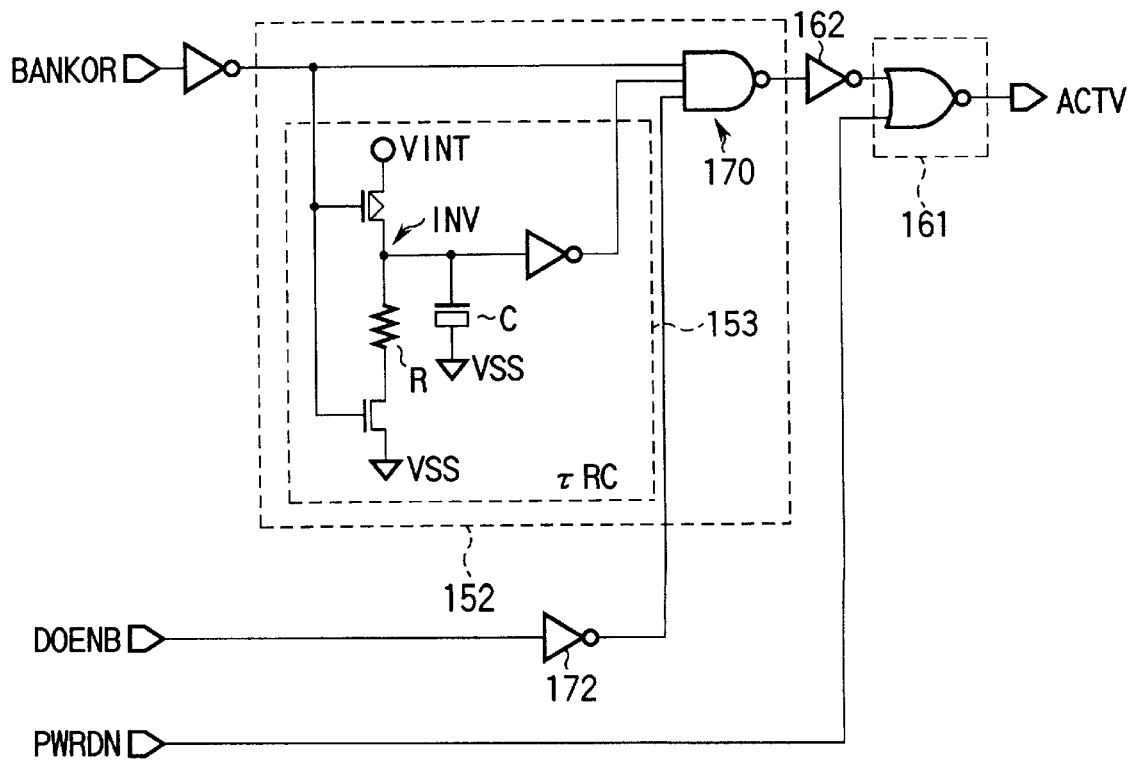
FIG. 9 is a circuit diagram showing the sixth circuit example of the control circuit.

FIG. 9 is a circuit diagram showing the sixth circuit example of the control circuit 51.

As shown in FIG. 9, the third input of the output stage 170 of the delay circuit 152 constituted by the NAND circuit receives a signal obtained by inverting the signal DOENB by the inverter 172. The switching circuit 161 constituted by the NOR circuit is arranged at the output of the delay circuit 152. The first input of the NOR circuit constituting the switching circuit 161 receives a signal obtained by inverting an output signal from the delay circuit 152 by the inverter 162. The second input receives the signal PWRDN.

The NAND circuit constituting the output stage 170 is active at "H" level, and the NOR circuit constituting the switching circuit 161 is active at "L" level.

The sixth circuit example therefore performs the following operation:

(1) When no data is output, the output stage 170 changes the logic level of the signal ACTV in accordance with the logic level of the signal BANKOR.

(2) When data is output, the output stage 170 fixes the logic level of the signal ACTV to "H" level regardless of the logic level of the signal BANKOR to continuously operate the activation voltage generation circuit 32.

(3) In remaining modes except for the power-down mode, the switching circuit 161 changes the logic level of the signal ACTV in accordance with the output level of the delay circuit 152.

(4) In the power-down mode, the switching circuit 161 fixes the logic level of the signal ACTV to "L" level regardless of the output level of the delay circuit 152 to stop operation of the activation voltage generation circuit 32.

In this way, in the sixth circuit example, the activation voltage generation circuit 32 can be continuously operated during output of data regardless of the logic level of the signal BANKOR. Therefore, a lack of the internal power supply voltage VINT during output of data can be avoided.

In addition, since the logic level of the signal ACTV can be fixed to "L" level in the power-down mode regardless of the output level of the delay circuit 152, operation of the activation voltage generation circuit 32 can be stopped in the power-down mode. This can suppress the current consumption during the power-down mode.

In the sixth circuit example, the signal PWRDN representing the power-down mode has priority over the signal DOENB representing output of data.

[Seventh Circuit Example]

The seventh circuit example can cope with the power-down mode and can continuously operate the activation voltage generation circuit 32 during output of data, similar to the sixth circuit example.

Figure 10:
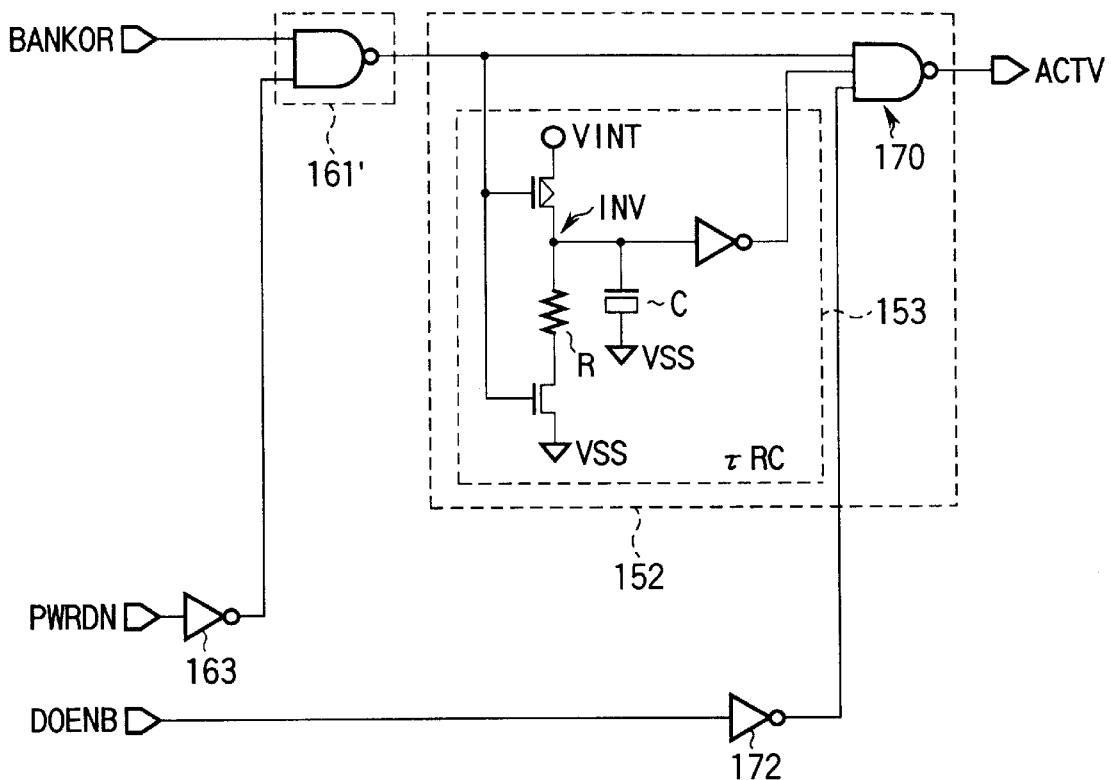
FIG. 10 is a circuit diagram showing the seventh circuit example of the control circuit.

FIG. 10 is a circuit diagram showing the seventh circuit example of the control circuit 51.

As shown in FIG. 10, the seventh circuit example is different from the sixth circuit example in that the switching circuit 161' for fixing the logic level of the signal ACTV to "L" level in the power-down mode regardless of the logic level of the signal BANKOR is arranged at the input of the delay circuit 152. The switching circuit 161' is constituted by the NAND circuit.

Both the NAND circuits respectively constituting the output stage 170 and switching circuit 161' are active at "H" level.

The seventh circuit example performs the following operation:

(1) In remaining modes except for the power-down mode, the switching circuit 161' changes the logic level of the signal ACTV in accordance with the logic level of the signal BANKOR.

(2) In the power-down mode, the switching circuit 161' fixes the logic level of the signal ACTV to "L" level regardless of the logic level of the signal BANKOR to stop operation of the activation voltage generation circuit 32.

(3) When no data is output, the output stage 170 changes the logic level of the signal ACTV in accordance with the logic level of the signal BANKOR.

(4) When data is output, the output stage 170 fixes the logic level of the signal ACTV to "H" level regardless of the logic level of the signal BANKOR to continuously operate the activation voltage generation circuit 32.

In the seventh circuit example, since the logic level of the signal ACTV can be fixed to "L" level in the power-down mode regardless of the logic level of the signal BANKOR, operation of the activation voltage generation circuit 32 can be stopped. This can suppress the current consumption during the power-down mode.

Further, the activation voltage generation circuit 32 can be continuously operated during output of data regardless of the logic level of the signal BANKOR. Therefore, a lack of the internal power supply voltage VINT during output of data can be avoided.

In the seventh circuit example, the signal DOENB representing output of data has priority over the signal PWRDN representing the power-down mode.

When the synchronous DRAM enters the power-down mode, the signal ACTV can be decreased from "H" level to "L" level after the lapse of the delay time τRC.

[Eighth Circuit Example]

The eighth circuit example can cope with the power-down mode and can continuously operate the activation voltage generation circuit 32 during output of data, like the sixth and seventh circuit examples.

Figure 11:
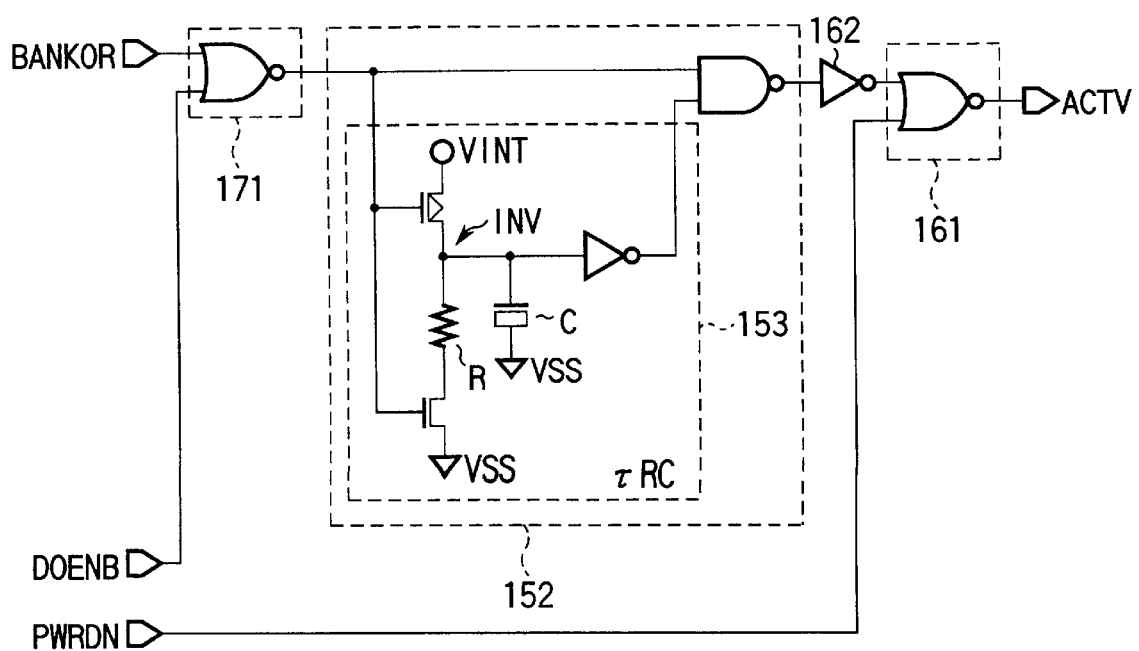
FIG. 11 is a circuit diagram showing the eighth circuit example of the control circuit.

FIG. 11 is a circuit diagram showing the eighth circuit example of the control circuit 51.

As shown in FIG. 11, the eighth circuit example is different from the sixth circuit example in that the switching circuit 171 constituted by the NOR circuit for fixing the output level of the delay circuit 152 to "H" level during output of data regardless of the logic level of the signal BANKOR is arranged at the input of the delay circuit 152.

Both the NOR circuits respectively constituting the switching circuits 161 and 171 are active at "L" level.

The eighth circuit example performs the following operation:

(1) When no data is output, the switching circuit 171 changes the output level of the delay circuit 152 in accordance with the logic level of the signal BANKOR.

(2) When data is output, the switching circuit 171 fixes the output level of the delay circuit 152 to "H" level regardless of the logic level of the signal BANKOR to continuously operate the activation voltage generation circuit 32.

(3) In remaining modes except for the power-down mode, the switching circuit 161 changes the logic level of the signal ACTV in accordance with the output level of the delay circuit 152.

(4) In the power-down mode, the switching circuit 161 fixes the logic level of the signal ACTV to ALL level regardless of the output level of the delay circuit 152 to stop operation of the activation voltage generation circuit 32.

In the eighth circuit example, the activation voltage generation circuit 32 can be continuously operated during output of data regardless of the logic level of the signal BANKOR. Consequently, a lack of the internal power supply voltage VINT during output of data can be avoided.

In the power-down mode, the logic level of the signal ACTV can be fixed to "L" level regardless of the output level of the delay circuit 152 to stop operation of the activation voltage generation circuit 32. This can suppress the current consumption during the power-down mode.

In the eighth circuit example, the signal PWRDN representing the power-down mode has priority over the signal DOENB representing output of data.

After data is output, the signal ACTV can be changed from "H" level to "L" level upon the lapse of the delay time τRC.

[Ninth Circuit Example]

The ninth circuit example can cope with the power-down mode and can continuously operate the activation voltage generation circuit 32 during output of data, similar to the sixth to eighth circuit examples.

Figure 12:
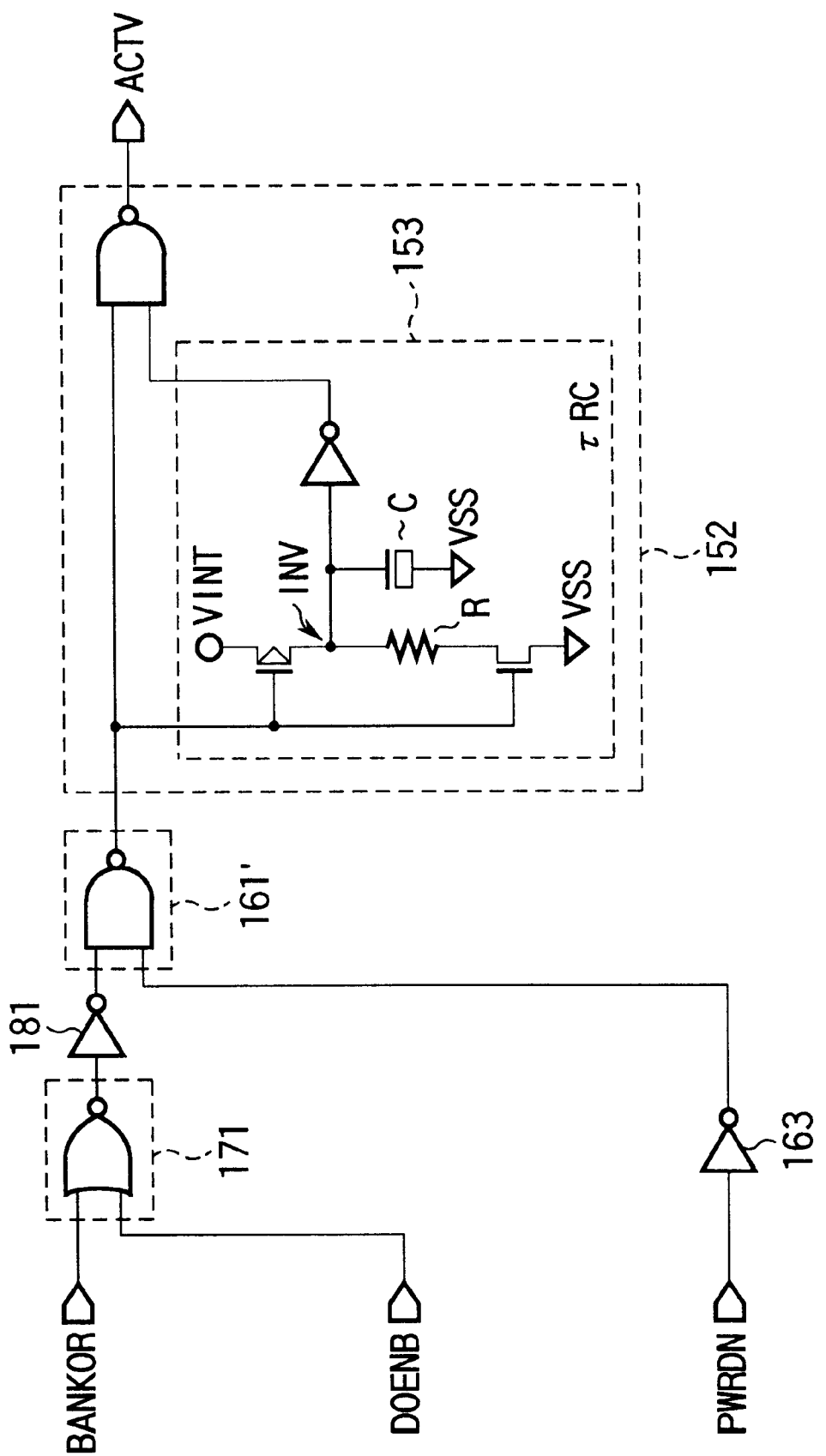
FIG. 12 is a circuit diagram showing the ninth circuit example of the control circuit.

FIG. 12 is a circuit diagram showing the ninth circuit example of the control circuit 51.

As shown in FIG. 12, in the ninth circuit example, the switching circuit 171 constituted by the NOR circuit for fixing the logic level of the signal ACTV to "H" level during output of data regardless of the logic level of the signal BANKOR is arranged at the input of the delay circuit 152.

In the power-down mode, the switching circuit 161' constituted by the NAND circuit for fixing the logic level of the signal ACTV to "L" level regardless of the output level of the switching circuit 171 is arranged between the switching circuit 171 and the input of the delay circuit 152. An output from the switching circuit 171 is inverted by an inverter 181, and the inverted output is supplied to the input of the switching circuit 161'.

This arrangement makes the ninth circuit example different from the sixth circuit example.

The NOR circuit constituting the switching circuit 171 is active at "L" level, and the NAND circuit constituting the switching circuit 161' is active at "H" level.

The ninth circuit example performs the following operation:

(1) When no data is output, the switching circuit 171 changes its input level to the switching circuit 161' in accordance with the logic level of the signal BANKOR.

(2) When data is output, the switching circuit 171 fixes its input level to the switching circuit 161' to "L" level regardless of the logic level of the signal BANKOR (note that an output from the switching circuit 171 is at "H" level immediately before it is input to the switching circuit 161').

(3) In remaining modes except for the power-down mode, the switching circuit 161' changes the logic level of the signal ACTV in accordance with the output level of the switching circuit 171.

(4) In the power-down mode, the switching circuit 161' fixes the logic level of the signal ACTV to "H" level regardless of the output level of the switching circuit 171 to stop operation of the activation voltage generation circuit 32.

In the ninth circuit example, the activation voltage generation circuit 32 can be continuously operated during output of data regardless of the logic level of the signal BANKOR. Therefore, a lack of the internal power supply voltage VINT during output of data can be avoided.

In the power-down mode, the logic level of the signal ACTV can be fixed to "H" level regardless of the output level of the switching circuit 171 to stop operation of the activation voltage generation circuit 32. This can suppress the current consumption during the power-down mode.

In the ninth circuit example, the signal PWRDN representing the power-down mode has priority over the signal DOENB representing output of data.

After data is output or the synchronous DRAM enters the power-down mode, the signal ACTV is changed from "H" level to "L" level upon the lapse of the delay time τRC.

[Operation Timing]

An example of the operation timing of the synchronous DRAM according to the present invention will be explained.

Figure 13:
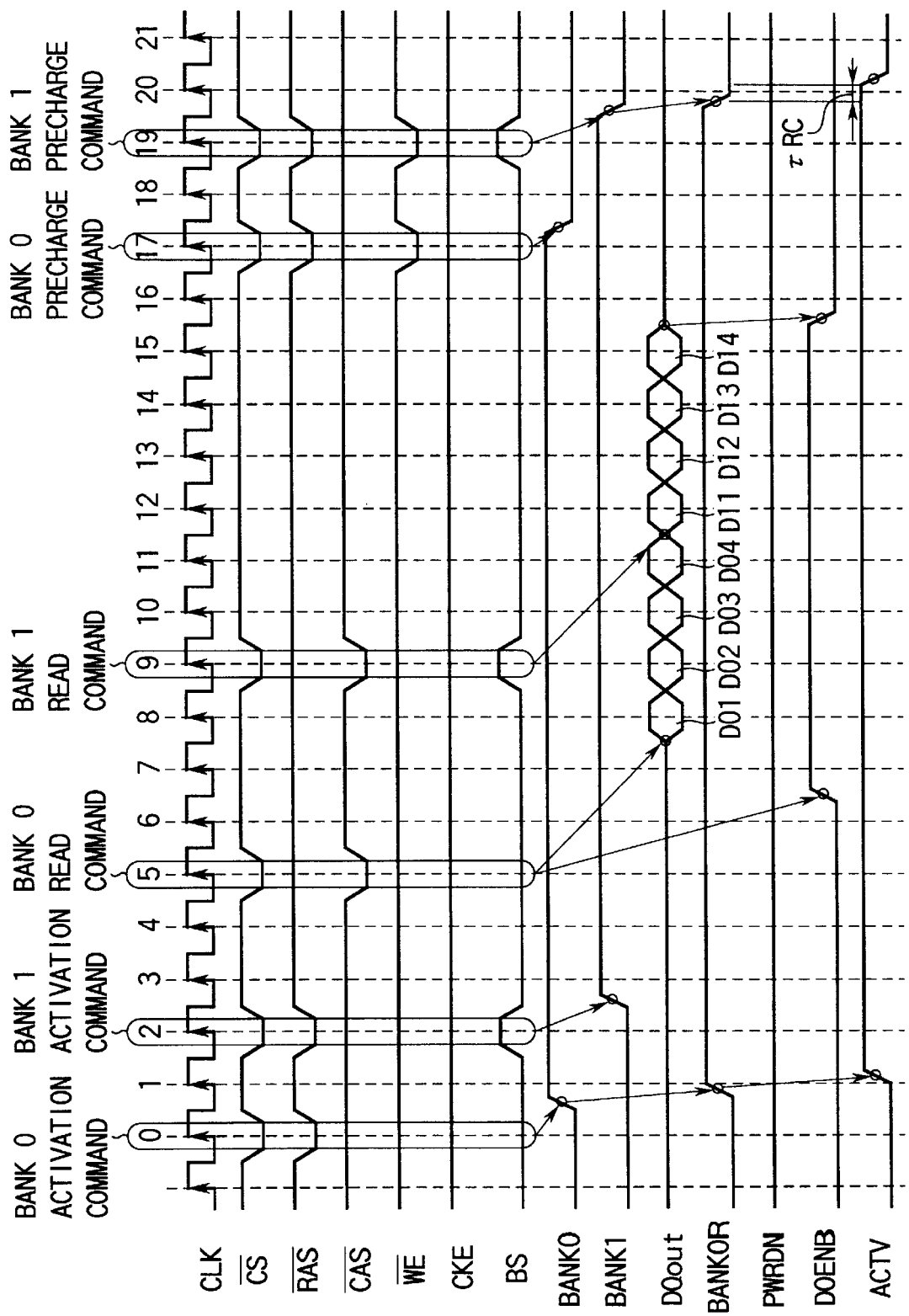
FIG. 13 is an operation timing chart showing the operation timing of the synchronous DRAM according to the embodiment of the present invention.
Figure 14:
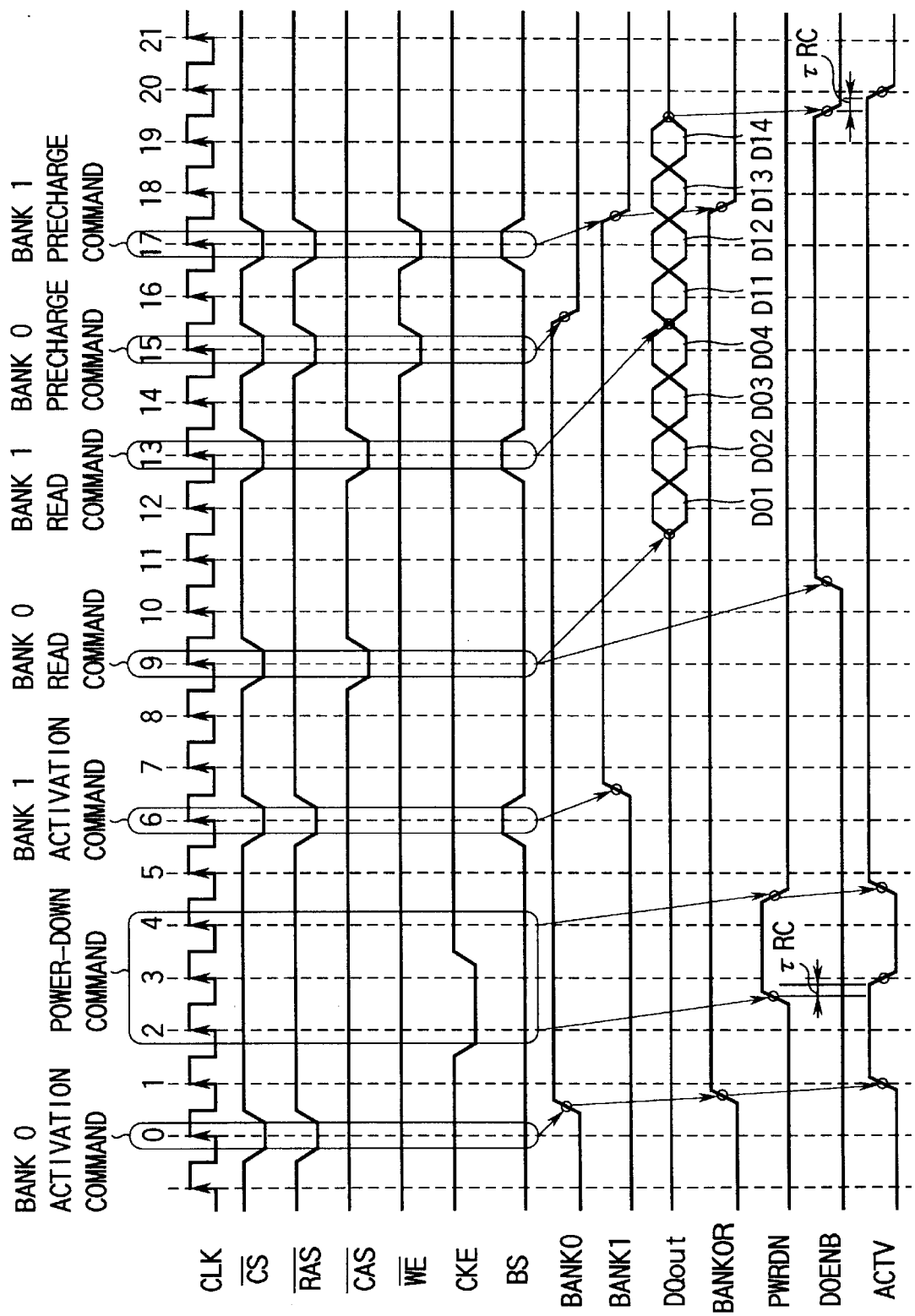
FIG. 14 is an operation timing chart showing the operation timing of the synchronous DRAM according to the embodiment of the present invention.

FIGS. 13 and 14 are operation timing charts each showing the operation timing of the synchronous DRAM according to the present invention.

FIGS. 13 and 14 show changes in signals within the chip in accordance with an input command. Note that the device mode is set to a CAS latency of 3 and a burst length of 4.

FIG. 13 shows the waveforms of the signals BANK0, BANK1, BANKOR, PWRDN, DOENB, and ACTV within the chip in accordance with six states, i.e., when a bank 0 activation command is input, a bank 1 activation command is input, a bank 0 read command is input, a bank 1 read command is input, a bank 0 precharge command is input, and a bank 1 precharge command is input.

As shown in FIG. 13, in cycle 0, a bank 0 activation command is input. Upon reception of this command, a signal BANK0 for activating bank 0 rises from "L" level to "H" level. Upon reception of the rise of the signal BANK0, the signal BANKOR rises from "L" level to "H" level. Upon reception of the "H"-level signal BANKOR, the signal ACTV for operating the activation voltage generation circuit 32 rises from "L" level to "H" level. The "H"-level signal ACTV operates the activation voltage generation circuit 32 to generate the internal power supply voltage VINT.

In cycle 2, when a bank 1 activation command is input, the signal BANK1 for activating bank 1 rises from "L" level to "H" level. At this time, the signal BANKOR is kept at "H" level.

In cycle 5, when a bank 0 read command is input, the signal DOENB representing output of data rises from "L" level to "H" level. Since the mode is set to a CAS latency of "3" and a burst length of "4", a total of four data, i.e., data (D01 to D04) from bank 0 are successively output every cycle starting from cycle 8, which is the third cycle from cycle 5 in which the bank 0 read command is input.

In cycle 9, when a bank 1 read command is input, a total of four data, i.e., data (D11 to D14) from bank 1 are successively output every cycle starting from cycle 12, which is the third cycle from cycle 9.

In cycle 15, when the final data (D14). is output from bank 1 to complete output of data, the signal DOENB representing output of data falls from "H" level to "L" level. At this time, since the signal BANKOR is kept at "H" level, the logic level of the signal ACTV does not change.

In cycle 17, when a bank 0 precharge command is input, the signal BANK0 falls from "H" level to "L" level. At this time, since the signal BANK1 is at "H" level, the signal BANKOR maintains "H" level. Therefore, the logic level of the signal ACTV does not change.

In cycle 19, when a bank 1 precharge command is input, the signal BANK1 falls from "H" level to "L" level. Upon reception of this, the signal BANKOR falls from "H" level to "L" level. After that, the signal ACTV falls from "H" level to "L" level upon the lapse of the delay time τRC set in the delay circuit 152. The "L"-level signal ACTV stops operating the activation voltage generation circuit 32.

FIG. 14 shows the waveforms of the signals BANK0, BANK1, BANKOR, PWRDN, DOENB, and ACTV within the chip when a power-down command is input, and a precharge command is input to both banks 0 and 1 during output of data.

As shown in FIG. 14, in cycle 2, when a power-down command is input, the signal PWRDN representing a power-down state rises from "L" level to "H" level. Upon reception of this, the signal ACTV falls from "H" level to "L" level upon the lapse of the delay time τRC even if the signal BANKOR is at "H" level. The "L"-level signal ACTV stops operating the activation voltage generation circuit 32. Note that no delay time τRC is set in the circuit examples shown in FIGS. 5, 9, and 11.

In cycle 4, when the power-down command is canceled, the signal PWRDN falls from "H" level to "L" level. Then, the signal ACTV rises from "L" level to "H" level if the signal BANKOR is at "H" level. The "H"-level signal ACTV operates the activation voltage generation circuit 32.

In cycle 15, when a bank 0 precharge command is input, the signal BANK0 falls from "H" level to "L" level. At this time, since the signal BANK1 is at "H" level, the signal BANKOR maintains "H" level. The logic level of the signal ACTV does not change.

In cycle 17, when a bank 1 precharge command is input, the signal BANK1 falls from "H" level to "L" level. Upon reception of this, the signal BANKOR falls from "H" level to "L" level. However, since data from bank 1 is being burst-output, the signal DOENB maintains "H" level. For this reason, even if the signal BANKOR falls from "H" level to "L" level, the logic level of the signal ACTV does not change, and the activation voltage generation circuit 32 continuously operates.

In cycle 19, when final data (D14) is output from bank 1 to complete a read of data, the signal DOENB representing output of data falls from "H" level to "L" level. At this time, since the BANKOR is at "L" level, the signal ACTV falls from "H" level to "L" level upon the lapse of the delay time τRC set in the delay circuit 152. The "L"-level signal ACTV stops operating the activation voltage generation circuit 32. Note that no delay time τRC is set in the circuit examples shown in FIGS. 7, 9, and 10.

As described above, in the synchronous DRAM according to the present invention, the activation voltage generation circuit 32 operates while at least the signal BANKOR is at "H" level.

When a power-down command is input, even if the signal BANKOR is at "H" level, operation of the activation voltage generation circuit 32 stops (particularly in the circuit examples shown in FIGS. 5, 6, and 9 to 12).

When a precharge command is input, even if the signal BANKOR is at "L" level, the activation voltage generation circuit 32 continuously operates during output of data (particularly in the circuit examples shown in FIGS. 7 to 12).

[10th Circuit Example]

In the synchronous DRAM, a power-down command can be input at the same time as a bank activation command.

However, inputting the power-down command at the same time as the bank activation command may stop operation of the activation voltage generation circuit 32 to cause a lack of the internal power supply voltage VINT during a period of amplifying the potential difference between a pair of bit lines in accordance with read data after the rise of the word line, in which the internal power supply voltage VINT is most consumed.

In the 10th circuit example, even if the power-down command is input at the same time as the bank activation command, operation of the activation voltage generation circuit 32 is prevented from stopping during at least the period of amplifying the potential difference between a pair of bit lines in accordance with read data after the rise of the word line.

Figure 15:
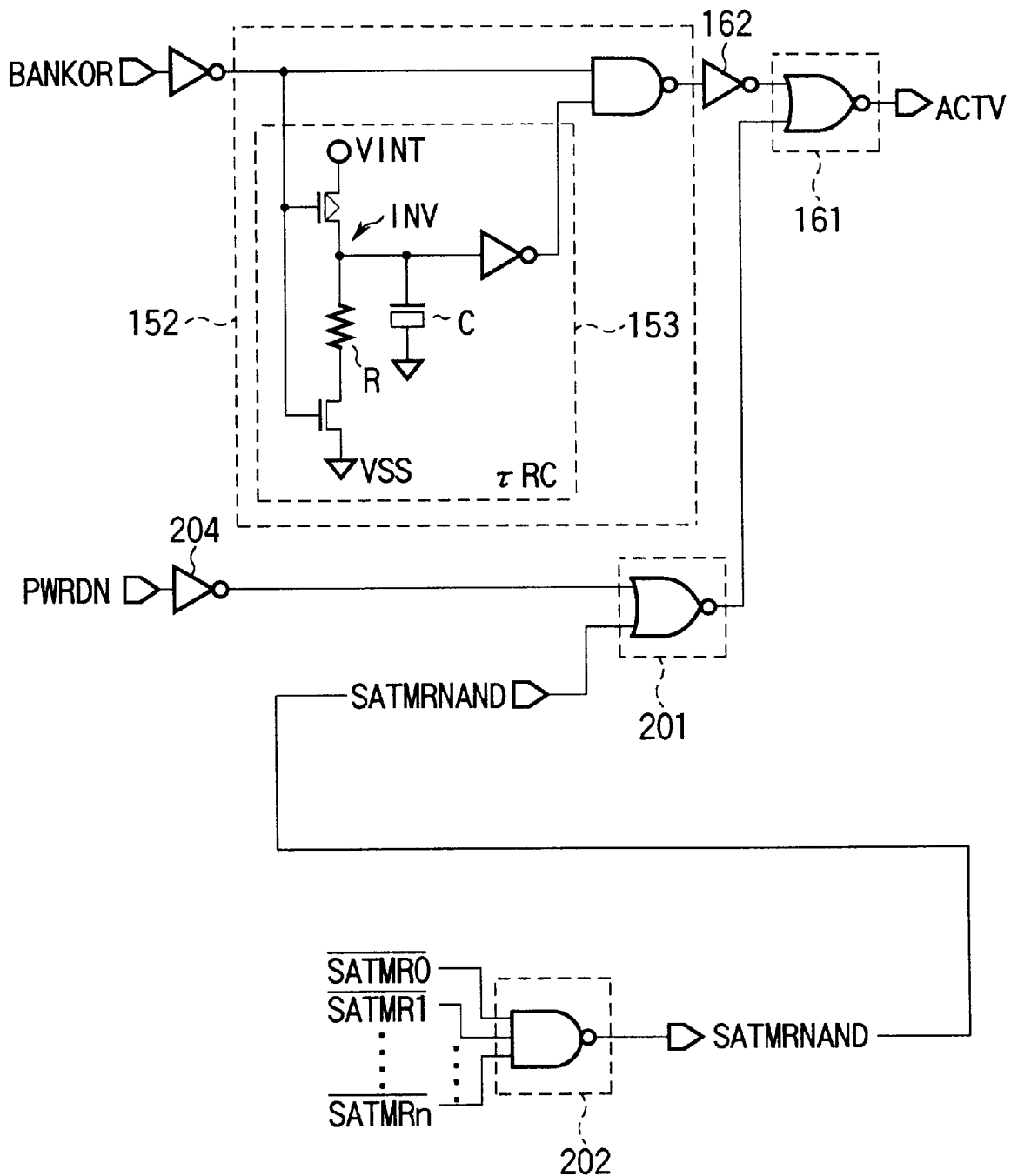
FIG. 15 is a circuit diagram showing the 10th circuit example of the control circuit.

FIG. 15 is a circuit diagram showing the 10th circuit example of the control circuit 51.

As shown in FIG. 15, in the 10th circuit example, a switching circuit 201 is further arranged at the input of the switching circuit 161 in the second circuit example shown in FIG. 5. The switching circuit 201 in the 10th circuit example is constituted by a NOR circuit. The first input of the NOR circuit receives a signal obtained by inverting the signal PWRDN by an inverter 204. The second input receives a signal SATMRNAND. In FIG. 15, a circuit 202 NANDs signals /SATMR0 to /SATMRn to generate the signal SATMRNAND. The signals /SATMR0 to /SATMRn are generated as follows.

Figure 16:
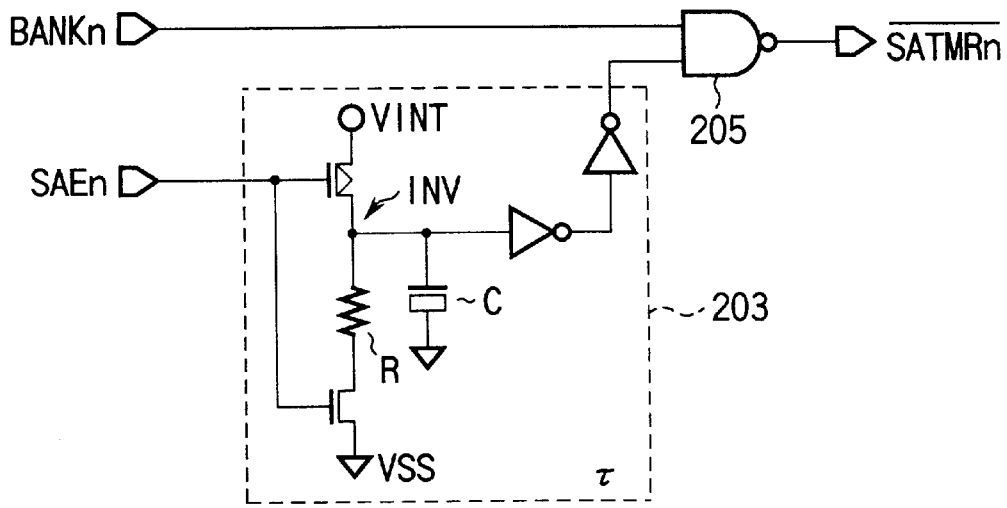
FIG. 16 is a circuit diagram showing a circuit example of a sense amplifier timer circuit.
Figure 17:
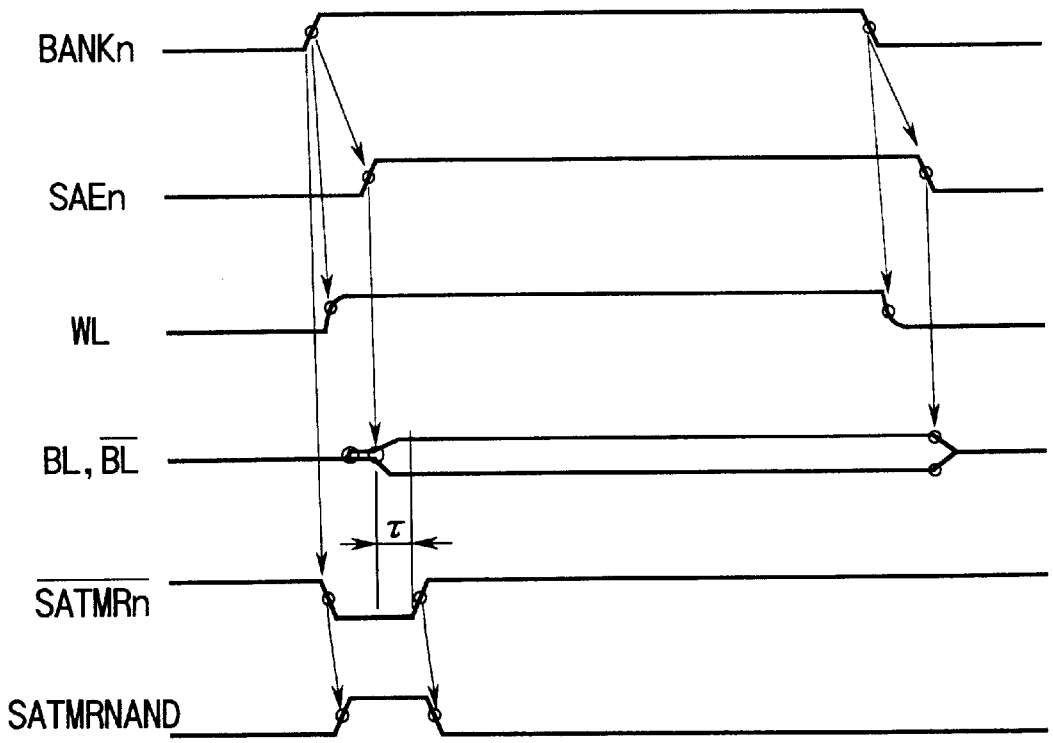
FIG. 17 is an operation waveform chart showing operation of the sense amplifier timer circuit.

FIG. 16 is a circuit diagram showing a circuit example of a sense amplifier timer circuit for generating the signal /SATMR (/SATMRn). FIG. 17 is a waveform chart showing operation of the circuit shown in FIG. 16.

As shown in FIG. 16, the sense amplifier timer circuit NANDs a signal BANKn representing activation of the bank and an inverted signal of a signal SAEn for enabling operation of the sense amplifier to generate the signal /SATMRn. The signal SAEn is delayed by the delay time τ by a delay stage 203 of the sense amplifier timer circuit, and then supplied to a NAND circuit 205 constituting the output stage of the timer circuit.

As shown in FIG. 17, the signal SAEn rises from "L" level to "H" level upon the lapse of a predetermined time after the signal BANKn rises from "L" level to "H" level.

When the signal BANKn rises from "L" level to "H" level, the signal /SATMRn falls from "H" level to "L" level. When the signal SAEn rises to "H" level, the signal /SATMRn rises from "L" level to "H" level upon the lapse of the time τ.

The delay time τ is equal to or longer than a time required to raise the signal SAEn from "L" level to "H" level, activate the sense amplifier, and sufficiently amplify the potential difference between a pair of bit lines BL and /BL. While the signal /SATMRn is at "L" level, the signal SATMRNAND output from the circuit 202 shown in FIG. 15 is at "H", level. The signal SATMRNAND is supplied to the switching circuit 201.

The NOR circuit constituting the switching circuit 201 is active at "L" level. Accordingly, when the signal SATMRNAND is at "L" level, the NOR circuit constituting the switching circuit 201 functions as an inverter.

The 10th circuit example performs the following operation:

(1) While the signal SATMRNAND is at "L" level, the switching circuit 201 changes its input level to the switching circuit 161 in accordance with the logic level of the signal PWRDN.

(2) While the signal SATMRNAND is at "H" level, the switching circuit 201 fixes its output to "L" level regardless of the logic level of the signal PWRDN. The switching circuit 161 changes the logic level of the signal ACTV in accordance with the output level of the delay circuit 152 regardless of the logic level of the signal PWRDN.

In the 10th circuit example, even in the power-down mode, the activation voltage generation circuit 32 can be continuously operated while the bank is active, particularly until the word line WL rises, as shown in FIG. 17, the sense amplifier is activated, and the potential difference between a pair of bit lines BL and /BL is sufficiently amplified. If, for example, the power-down command is input at the same time as the bank activation command, a lack of the internal power supply voltage VINT can be avoided while data is amplified after a read of data.

[11th Circuit Example]

In the 11th circuit example, similar to the 10th circuit example, even if the power-down command is input at the same time as the bank activation command, operation of the activation voltage generation circuit 32 is prevented from stopping during at least the period of amplifying the potential difference between a pair of bit lines in accordance with read data after the rise of the word line.

Figure 18:
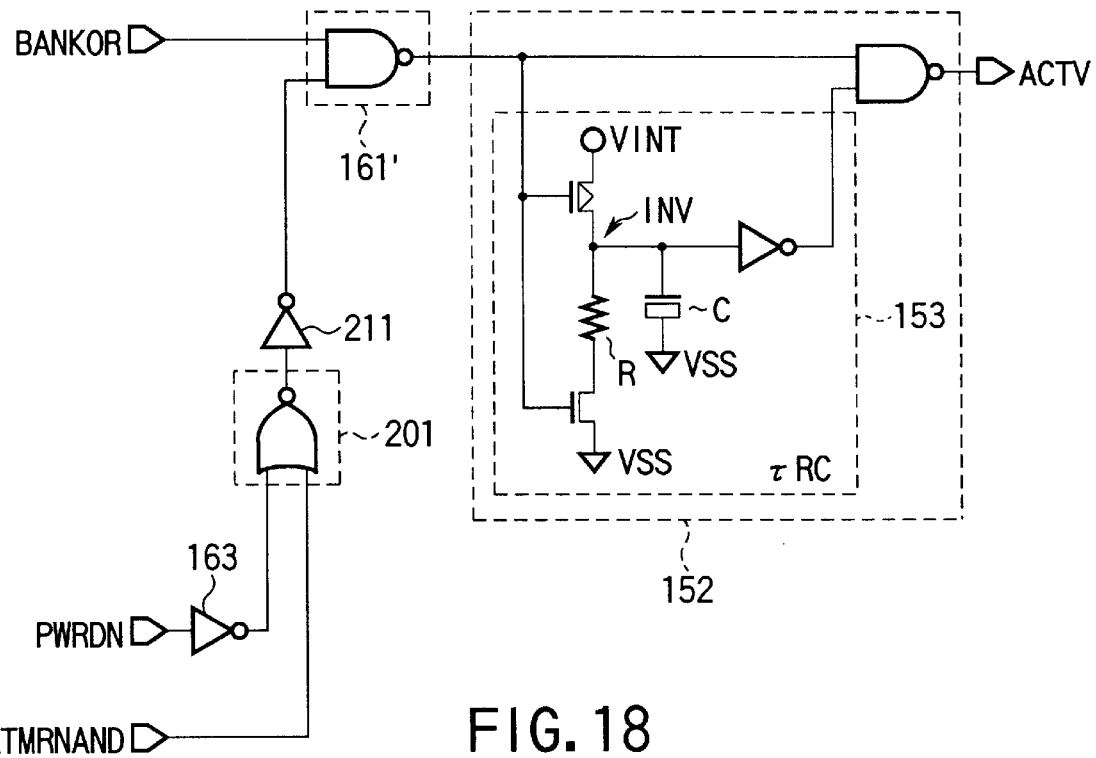
FIG. 18 is a circuit diagram showing the 11th circuit example of the control circuit.

FIG. 18 is a circuit diagram showing the 11th circuit example of the control circuit 51.

As shown in FIG. 18, in the 11th circuit example, the switching circuit 201 is further arranged at the input of the switching circuit 161' in the third circuit example shown in FIG. 6. The switching circuit 201 is constituted by a NOR circuit for fixing its output to "L" level regardless of the logic level of the signal PWRDN. The fixed "L"-level output is inverted to "H" level by an inverter 211, and then input to the switching circuit 161'.

The NOR circuit constituting the switching circuit 201 is active at "L" level, and the NAND circuit constituting the switching circuit 161' is active at "H" level.

The 11th circuit example performs the following operation:

(1) While the signal SATMRNAND is at "L" level, the switching circuit 201 changes its input level to the switching circuit 161' in accordance with the logic level of the signal PWRDN.

(2) While the signal SATMRNAND is at "H" level, the switching circuit 201 fixes its output to "L" level regardless of the logic level of the signal PWRDN. The switching circuit 161' changes the logic level of the signal ACTV in accordance with the logic level of the signal BANKOR regardless of the logic level of the signal PWRDN.

In the 11th circuit example, even in the power-down mode, the activation voltage generation circuit 32 can be continuously operated while the bank is active, particularly until the word line WL rises, the sense amplifier is activated, and the potential difference between a pair of bit lines BL and /BL is sufficiently amplified. If, for example, the power-down command is input at the same time as the bank activation command, a lack of the internal power supply voltage VINT can be avoided while data is amplified after a read of data.

[12th Circuit Example]

In the 12th circuit example, similar to the 10th and 11th circuit examples, even if the power-down command is input at the same time as the bank activation command, operation of the activation voltage generation circuit 32 is prevented from stopping during at least the period of amplifying the potential difference between a pair of bit lines in accordance with read data after the rise of the word line.

Figure 19:
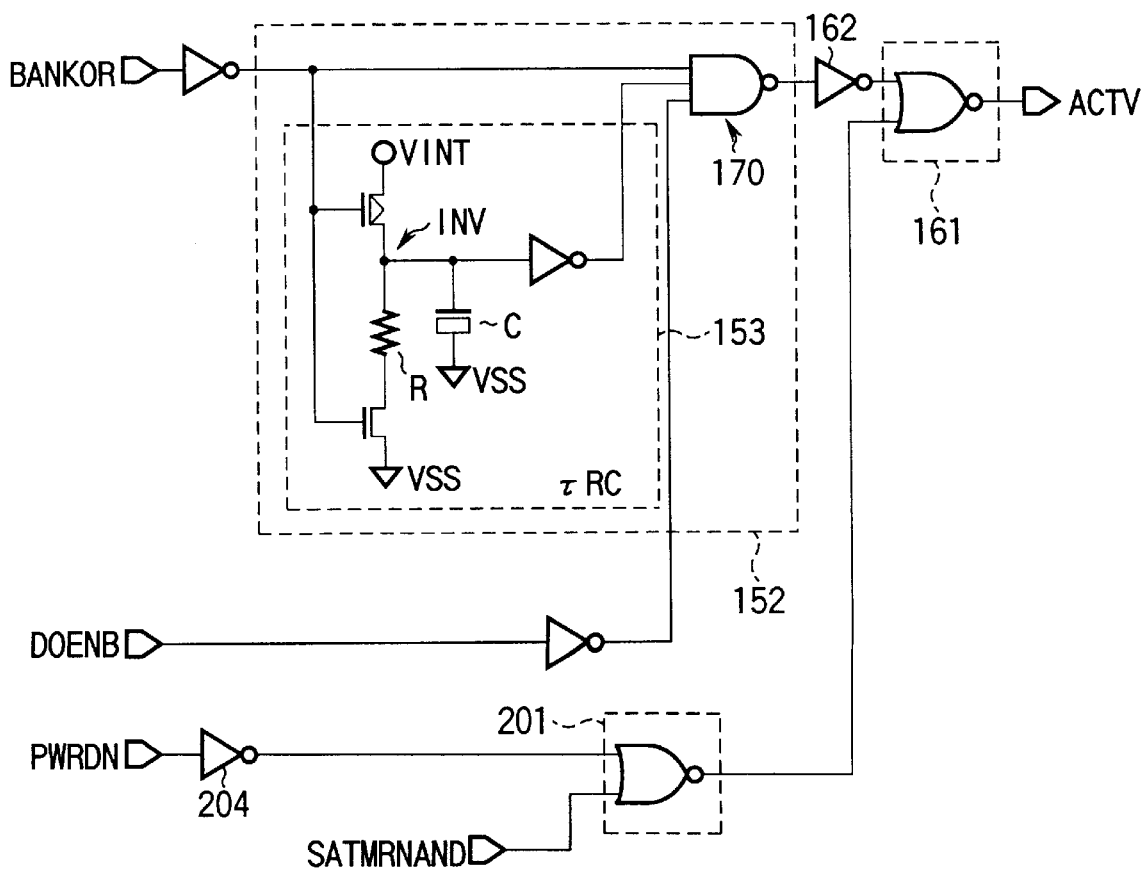
FIG. 19 is a circuit diagram showing the 12th circuit example of the control circuit.

FIG. 19 is a circuit diagram showing the 12th circuit example of the control circuit 51.

As shown in FIG. 19, in the 12th circuit example, the switching circuit 201 constituted by a NOR circuit is further arranged at the input of the switching circuit 161 in the sixth circuit example shown in FIG. 9.

Both the NOR circuits constituting the switching circuits 201 and 161 are active at "L" level.

The 12th circuit example performs the following operation:

(1) While the signal SATMRNAND is at "L" level, the switching circuit 201 changes its input level to the switching circuit 161 in accordance with the logic level of the signal PWRDN.

(2) While the signal SATMRNAND is at "H" level, the switching circuit 201 fixes its output to "L" level regardless of the logic level of the signal PWRDN. The switching circuit 161 changes the logic level of the signal ACTV in accordance with the output level of the delay circuit 152 regardless of the logic level of the signal PWRDN.

In the 12th circuit example, similar to the 10th and 11th circuit examples, even in the power-down mode, the activation voltage generation circuit 32 can be continuously operated while the bank is active, particularly until the word line WL rises, the sense amplifier is activated, and the potential difference between a pair of bit lines BL and /BL is sufficiently amplified. If, for example, the power-down command is input at the same time as the bank activation command, a lack of the internal power supply voltage VINT can be avoided while data is amplified after a read of data.

[13th Circuit Example]

In the 13th circuit example, similar to the 10th to 12th circuit examples, even if the power-down command is input at the same time as the bank activation command, operation of the activation voltage generation circuit 32 is prevented from stopping during at least the period of amplifying the potential difference between a pair of bit lines in accordance with read data after the rise of the word line.

Figure 20:
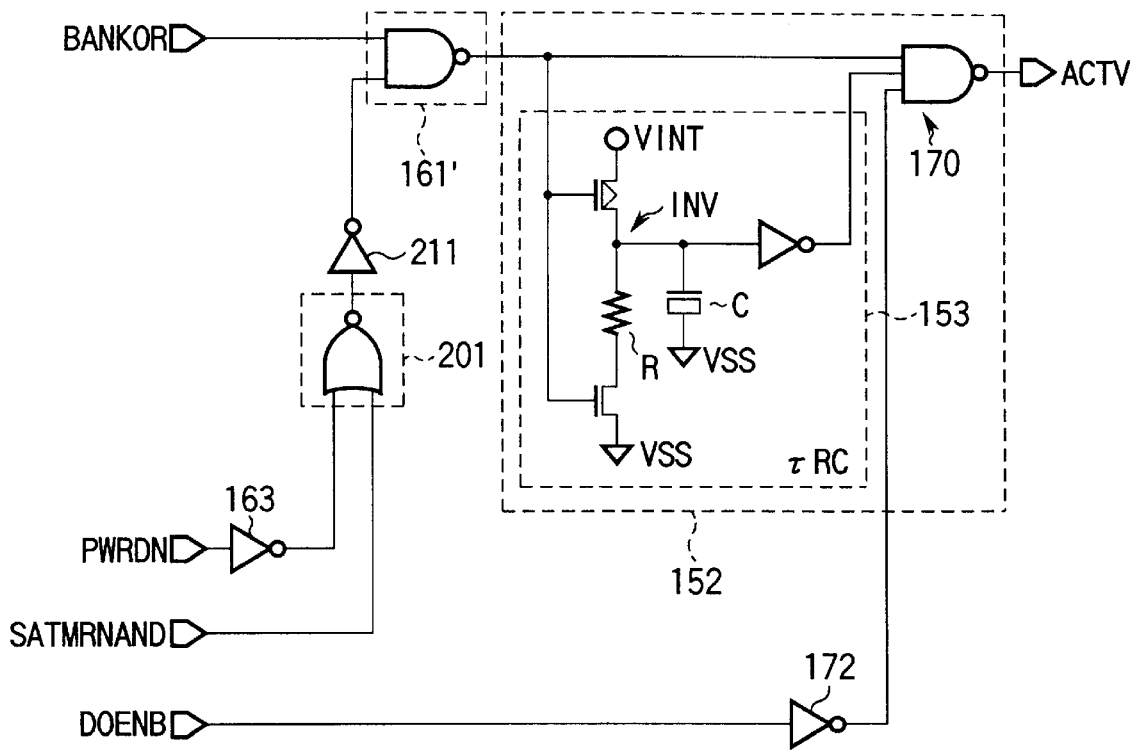
FIG. 20 is a circuit diagram showing the 13th circuit example of the control circuit.

FIG. 20 is a circuit diagram showing the 13th circuit example of the control circuit 51.

As shown in FIG. 20, in the 13th circuit example, the switching circuit 201 constituted by a NOR circuit is further arranged at the input of the switching circuit 161' in the seventh circuit example shown in FIG. 10.

The NOR circuit constituting the switching circuit 201 is active at "L" level, and the NAND circuit constituting the switching circuit 161' is active at "H" level.

The 13th circuit example performs the following operation:

(1) While the signal SATMRNAND is at "L" level, the switching circuit 201 changes its input level to the switching circuit 161' in accordance with the logic level of the signal PWRDN.

(2) While the signal SATMRNAND is at "H" level, the switching circuit 201 fixes its output to "L" level regardless of the logic level of the signal PWRDN. The switching circuit 161' changes the logic level of the signal ACTV in accordance with the logic level of the signal BANKOR regardless of the logic level of the signal PWRDN.

In the 13th circuit example, similar to the 10th to 12th circuit examples, even in the power-down mode, the activation voltage generation circuit 32 can be continuously operated while the bank is active, particularly until the word line WL rises, the sense amplifier is activated, and the potential difference between a pair of bit lines BL and /BL is sufficiently amplified. If, for example, the power-down command is input at the same time as the bank activation command, a lack of the internal power supply voltage VINT can be avoided while data is amplified after a read of data.

[14th Circuit Example]

In the 14th circuit example, similar to the 10th to 13th circuit examples, even if the power-down command is input at the same time as the bank activation command, operation of the activation voltage generation circuit 32 is prevented from stopping during at least the period of amplifying the potential difference between a pair of bit lines in accordance with read data after the rise of the word line.

Figure 21:
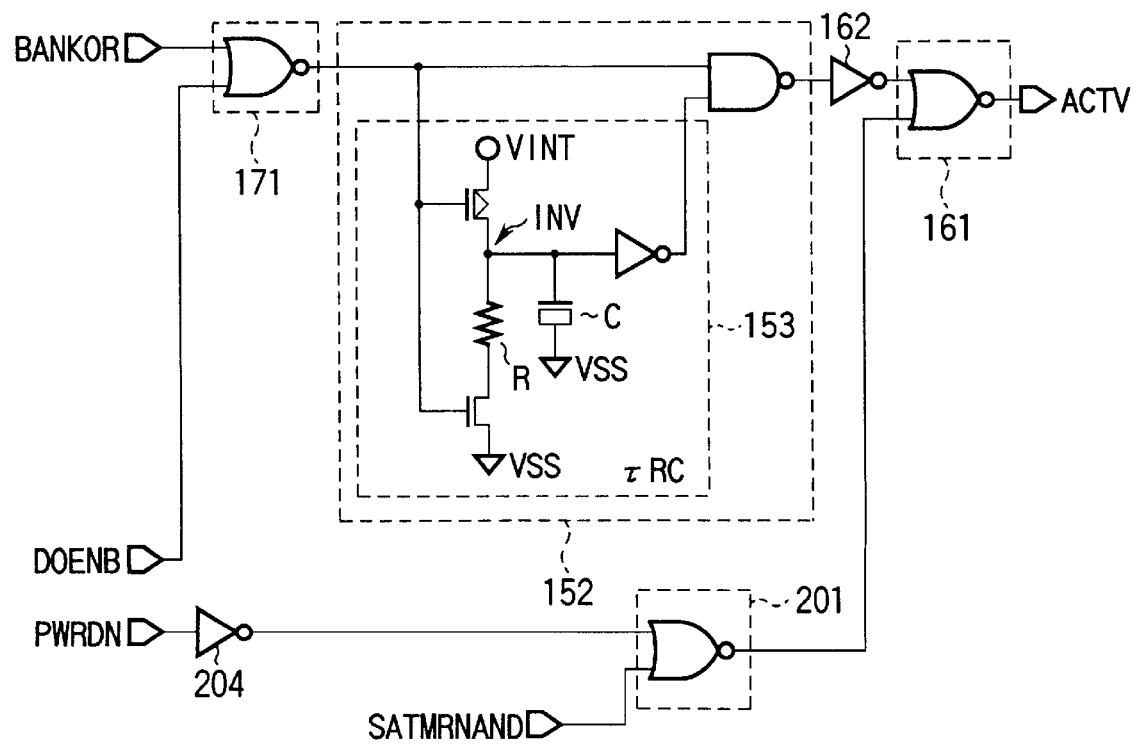
FIG. 21 is a circuit diagram showing the 14th circuit example of the control circuit.

FIG. 21 is a circuit diagram showing the 14th circuit example of the control circuit 51.

As shown in FIG. 21, in the 14th circuit example, the switching circuit 201 constituted by a NOR circuit is further arranged at the input of the switching circuit 161 in the eighth circuit example shown in FIG. 11.

Both the NOR circuits constituting the switching circuits 201 and 161 are active at "L" level.

The 14th circuit example performs the following operation:

(1) While the signal SATMRNAND is at "L" level, the switching circuit 201 changes its input level to the switching circuit 161 in accordance with the logic level of the signal PWRDN.

(2) While the signal SATMRNAND is at "H" level, the switching circuit 201 fixes its output to "L" level regardless of the logic level of the signal PWRDN. The switching circuit 161 changes the logic level of the signal ACTV in accordance with the output level of the delay circuit 152 regardless of the logic level of the signal PWRDN.

In the 14th circuit example, similar to the 10th to 13th circuit examples, even in the power-down mode, the activation voltage generation circuit 32 can be continuously operated while the bank is active, particularly until the word line WL rises, the sense amplifier is activated, and the potential difference between a pair of bit lines BL and /BL is sufficiently amplified. If, for example, the power-down command is input at the same time as the bank activation command, a lack of the internal power supply voltage VINT can be avoided while data is amplified after a read of data.

[15th Circuit Example]

In the 15th circuit example, similar to the 10th to 14th circuit examples, even if the power-down command is input at the same time as the bank activation command, operation of the activation voltage generation circuit 32 is prevented from stopping during at least the period of amplifying the potential difference between a pair of bit lines in accordance with read data after the rise of the word line.

Figure 22:
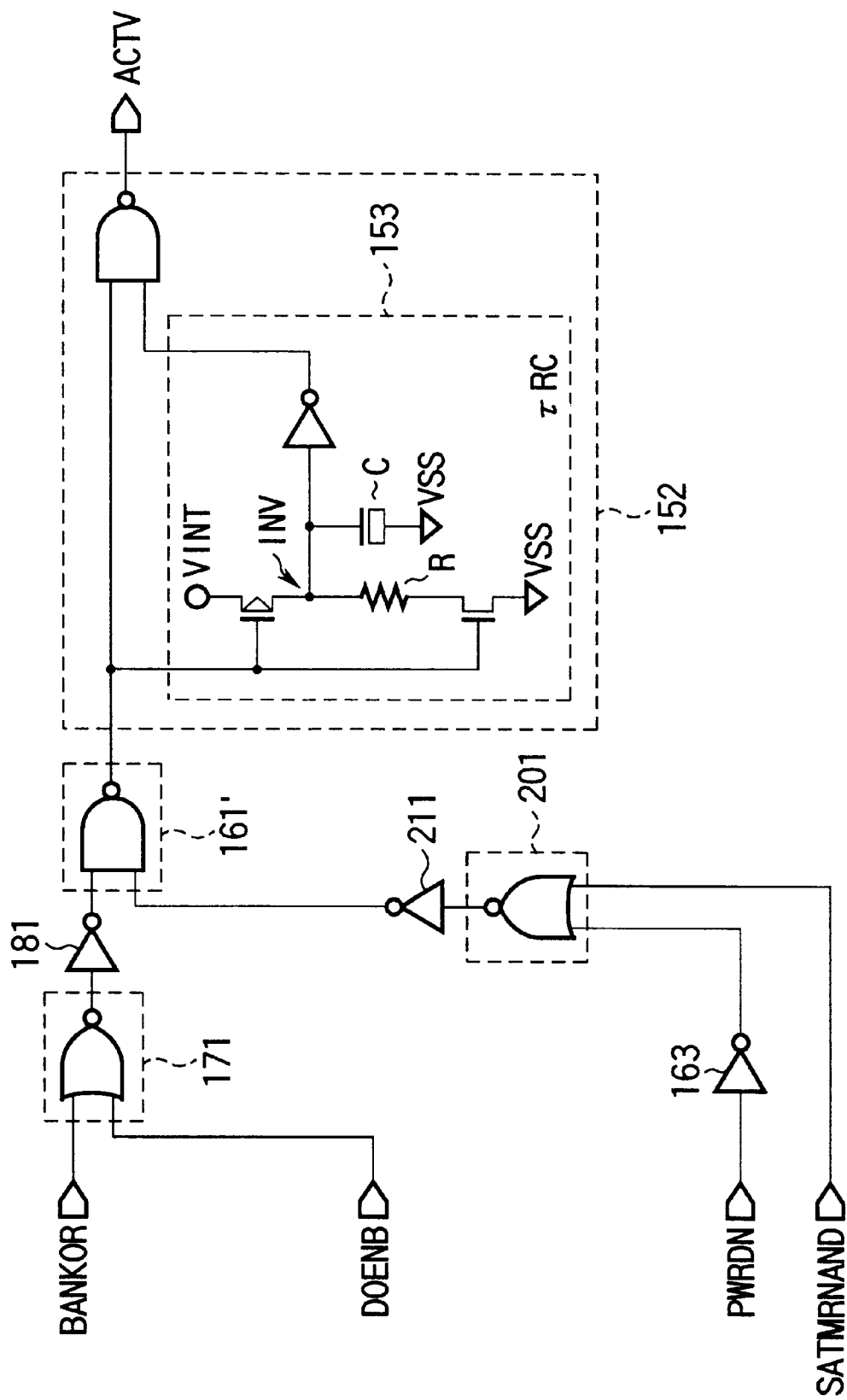
FIG. 22 is a circuit diagram showing the 15th circuit example of the control circuit.

FIG. 22 is a circuit diagram showing the 15th circuit example of the control circuit 51.

As shown in FIG. 22, in the 15th circuit example, the switching circuit 201 constituted by a NOR circuit is further arranged at the input of the switching circuit 161' in the ninth circuit example shown in FIG. 12.

The NOR circuit constituting the switching circuit 201 is active at "L" level, and the NAND circuit constituting the switching circuit 161' is active at "H" level.

The 15th circuit example performs the following operation:

(1) While the signal SATMRNAND is at "L" level, the switching circuit 201 changes its input level to the switching circuit 161' in accordance with the logic level of the signal PWRDN.

(2) While the signal SATMRNAND is at "H" level, the switching circuit 201 fixes its output to "L" level regardless of the logic level of the signal PWRDN. The switching circuit 161' changes the logic level-of the signal ACTV in accordance with the logic level of the signal BANKOR regardless of the logic level of the signal PWRDN.

In the 15th circuit example, similar to the 10th to 14th circuit examples, even in the power-down mode, the activation voltage generation circuit 32 can be continuously operated while the bank is active, particularly until the word line WL rises, the sense amplifier is activated, and the potential difference between a pair of bit lines BL and /BL is sufficiently amplified. If, for example, the power-down command is input at the same time as the bank activation command, a lack of the internal power supply voltage VINT can be avoided while data is amplified after a read of data.

In the synchronous DRAM according to the embodiment of the present invention, the internal power supply voltage generation unit 3 for generating the internal power supply voltage VINT is constituted by the two voltage generation circuits, i.e., the standby voltage generation circuit 31 requiring a small bias current and the activation voltage generation circuit 32 requiring a large bias current. Compared to a DRAM on which a conventional voltage generation circuit using an NMOS is mounted, the consumption amount of external power supply voltage VCC in a standby state can be reduced to promote further reduction in power consumption.

The synchronous DRAM comprises the control circuit 51 for operating the activation voltage generation circuit 32 when a plurality of banks are set within the chip and even one bank is active. The control circuit 51 allows to apply the internal power supply voltage generation unit 3 to a DRAM, e.g., synchronous DRAM in which a plurality of banks are set within the chip, in order to increase the operation speed.

Particularly in the control circuits 51 described in the first to 15th circuit examples, if an active bank exists in interleave bank activation operation, operation of the activation voltage generation circuit 32 does not stop, and the internal power supply voltage VINT can be satisfactorily supplied to the active bank.

Particularly in the control circuits 51 described in the second, third, and sixth to 15th circuit examples (FIGS. 5, 6, and 9 to 22), when the bank active state shifts to the power-down mode, even if the bank is active, operation of the activation voltage generation circuit 32 can be stopped to prevent the current consumption from exceeding the specification in the power-down mode.

Particularly in the control circuits 51 described in the 10th to 15th circuit examples (FIGS. 15 to 22), when the power-down and bank activation commands are simultaneously input, operation of the activation voltage generation circuit 32 can be stopped after the potential difference between a pair of bit lines BL and /BL is sufficiently amplified after the rise of the word line WL. Even in the power-down mode, when the internal power supply voltage VINT is necessary, operation of the activation voltage generation circuit 32 does not stop.

Particularly in the control circuits 51 described in the fourth to ninth and 12th to 15th circuit examples (FIGS. 7 to 12 and 19 to 22), when bust data output is performed upon completion of precharging, operation of the activation voltage generation circuit 32 does not stop, and a sufficient internal power supply voltage VINT can be supplied to the data output system circuit.

With respect to the embodiment, the explanation has been made for the case where the present invention is applied to a synchronous DRAM.

Figure 23:
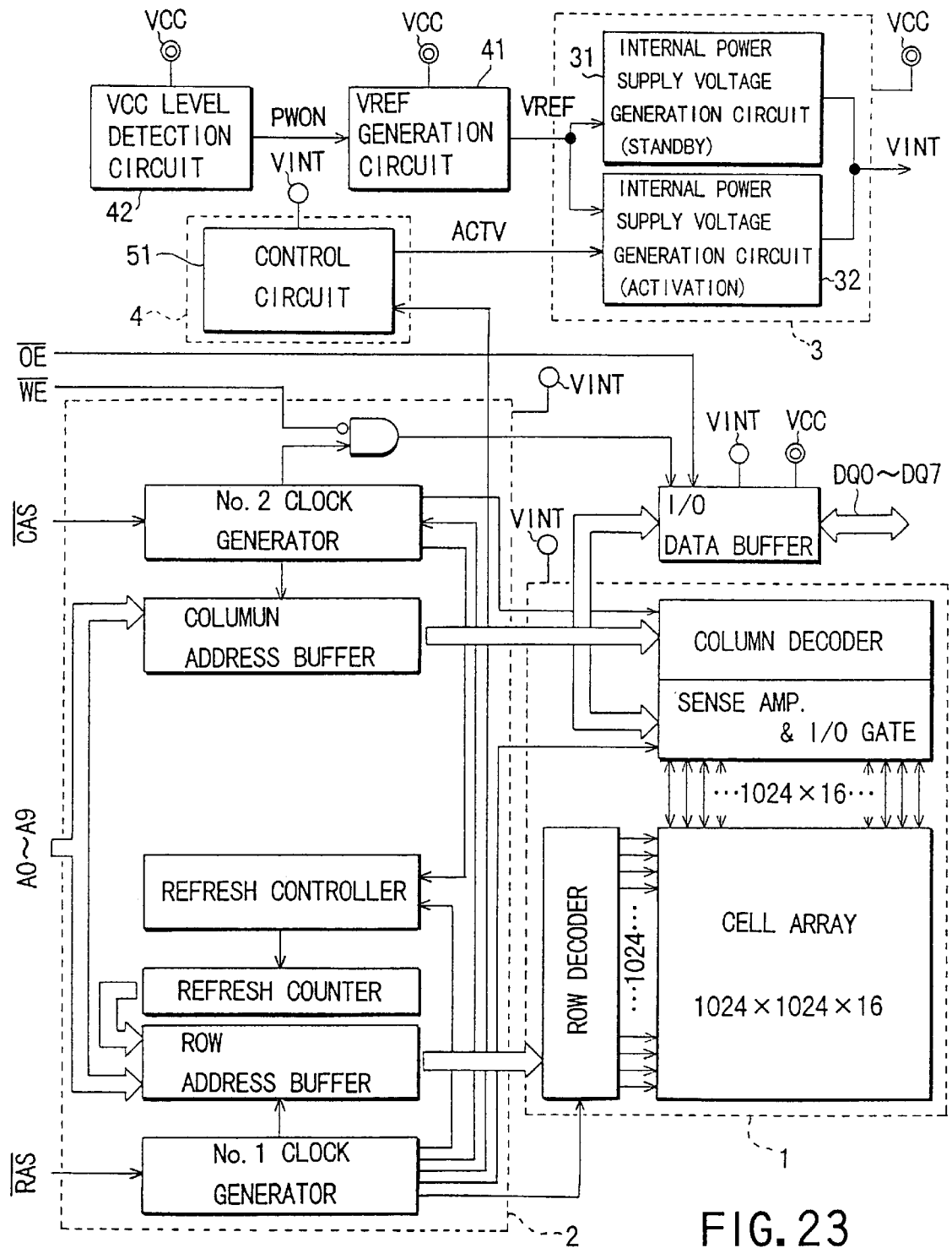
FIG. 23 is a block diagram showing a general-purpose DRAM to which the present invention is applied.

However, the present invention can also be applied to the general-purpose DRAM as shown FIG. 23.

As has been described above, according to the present invention, a semiconductor integrated circuit device having an internal power supply voltage generation circuit capable of reducing the consumption amount of external power supply voltage VCC and coping with a device which is internally divided into a plurality of banks can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. The semiconductor memory device comprising:
   a memory portion for storing data, said memory portion divided into a plurality of banks;
   an internal power supply voltage generator for generating an internal power supply voltage, said internal power supply voltage generator including a standby internal power supply circuit and an activation internal power supply circuit; and
   a controller for controlling said internal power supply voltage generator, said controller including a control circuit that activates said activation internal power supply circuit when at least one bank is active.

2. The device according to claim 1, wherein each of the plurality of banks is selected by corresponding activation signals and said control circuit activates said activation internal power supply circuit during output of data regardless of a value of a signal which is an OR of the activation signals.

3. The device according to claim 1, wherein said control circuit activates said activation internal power supply circuit in synchronism with an OR signal of signals that activates the plurality of the banks and inactivates said activation power supply circuit after both the OR signal commands an active state and all the banks are completely precharged.

4. The device according to claim 3, wherein said control circuit inactivates said activation internal power supply circuit in a power-down mode regardless of the OR signal.

5. The device according to claim 4, wherein said control circuit inactivates said activation internal power supply circuit in a power-down mode after both the OR signal commands an inactivation state and at least data from a memory cell arranged within said memory portion is completely amplified.

6. The device according to claim 5, wherein said control circuit activates said activation internal power supply circuit during output of data regardless of the OR signal.

7. The semiconductor memory device comprising:
   a memory portion for storing data, said memory portion divided into at least two banks, first and second banks each including at least one cell array and at least one sense amplifier, said first bank is activated in accordance with a first bank activation signal and said second bank is activated in accordance with a second bank activation signal;

an internal power supply voltage generator for generating an internal power supply voltage supplied to said memory portion from an external power supply voltage, said internal power supply voltage generator including a standby internal power supply circuit and an activation internal power supply circuit; and a controller for controlling said internal power supply voltage generator, said controller including a control circuit electrically connected to said activation internal power supply circuit, said control circuit activates said activation internal power supply circuit in accordance with the first and second bank activation signals.

8. The device according to claim 7, wherein said control circuit further comprises:

a first logic circuit receives the first and second bank activation signals and outputs a first control signal, said first logic circuit activates the first control signal when at least one of the first and second bank activation signals command an active state, and inactivates the first control signal when both the first and second bank activation signals command an inactive state;

a first delay circuit receives the first control signal and outputs a first delay signal, said first delay circuit changing the first delay signal from an active state to an inactive state upon a lapse of at least a time required to completely precharge said memory portion after start of precharging when the first control signal changes from an active state to an inactive state; and a second logic circuit receives the first control signal and the first delay signal and outputs a second control signal, said second logic circuit activates the second control signal when at least the first control signal changes from the inactive state to the active state, and inactivates the second control signal when both the first control signal and the first delay signal change to the inactive state.

9. The device according to claim 8, wherein said second logic circuit further receives a power-down mode signal, said second logic circuit inactivates the second control signal when the power-down mode signal commands a power-down mode regardless of the state of the first control signal and the first delay signal.

10. The device according to claim 8, wherein said first logic circuit further receives a power-down mode signal, said first logic circuit inactivates the first control signal when the power-down mode signal commands a power-down mode regardless of the state of the first and second bank activation signals.

11. The device according to claim 8, wherein said second logic circuit further receives a data output enable signal, said second logic circuit activates the second control signal when the data output enable signal commands output of data regardless of the state of the first control signal and the first delay signal.

12. The device according to claim 8, wherein said first logic circuit further receives a data output enable signal, said first logic circuit activates the first control signal when the data output enable signal commands output of data regardless of the state of the first and second control signals.

13. The device according to claim 12, wherein said first logic circuit further receives a power-down mode signal, said first logic circuit inactivates the first control signal when the power-down mode signal commands a power-down mode regardless of the state of the first and second control signals.

14. The device according to claim 8, wherein said control circuit further comprises:

a second delay circuit receives the first sense amplifier enable signal and outputs a second delay signal, said second delay circuit activates the second delay signal upon a lapse of at least a time required to amplify data after the first sense amplifier enable signal commands activation of said sense amplifier;

a third logic circuit receives the first bank activation signal and the second delay signal and outputs a third control signal, said third logic circuit activates the third control signal when at least the first bank activation signal commands activation of the bank, and inactivates the third control signal when both the first bank activation signal commands activation of the bank and the second delay signal commands an active state;

a third delay circuit receives the second sense amplifier enable signal and outputs a third delay signal, said third delay circuit activates the third delay signal upon a lapse of at least a time required to amplify data after the second sense amplifier enable signal commands activation of said sense amplifier;

a fourth logic circuit receives the second bank activation signal and the third delay signal and outputs a fourth control signal, said fourth logic circuit activates the fourth control signal when at least the second bank activation signal commands the activation of the bank, and inactivates the fourth control signal when both the second bank activation signal commands active of the bank and the third delay signal commands an active state;

a fifth logic circuit receives the third and fourth control signals and outputs a fifth control signal, said fifth logic circuit activates the fifth control signal when at least one of the third and fourth control signal command the active state, and inactivates the fifth control signal when both the third and fourth control signals command an inactive state;

a sixth logic circuit receives a power-down mode signal and the fifth control signal and outputs a sixth control signal, said sixth logic circuit activates the sixth control signal when the fifth control signal commands an active state regardless of the state of the power-down mode signal, and inactivates the sixth control signal when the fifth control signal commands an inactive state in accordance with the state of the power-down mode signal.

15. The device according to claim 14, wherein said second logic circuit further receives the sixth control signal, said second logic circuit inactivates the second control signal when the sixth control signal commands an inactive state regardless of the state of the first control signal and the first delay signal.

16. The device according to claim 14, wherein said first logic circuit further receives the sixth control signal, said first logic circuit inactivates the first control signal when the sixth control signal commands an inactive state regardless of the state of the first and second bank activation signals.

17. The device according to claim 15, wherein said second logic circuit further receives a data output enable signal, said second logic circuit activates the second control signal when both the data output enable signal commands the output of data and the sixth control signal commands the active state regardless of the state of the first control signal and the first delay signal, and inactivates the second control signal when the sixth control signal commands the inactive state regardless of state of the first control signal, the first delay signal and the data output enable signal.

18. The device according to claim 16, wherein said second logic circuit further receives a data output enable signal, said second logic circuit activates the second control signal when the data output enable signal commands output of data regardless of the state of the first control signal and the first delay signal.

19. The device according to claim 15, wherein said first logic circuit further receives a data output enable signal, said first logic circuit activates the first control signal when the data output enable signal commands output of data regardless of the state of the first and second control signals.

20. The device according to claim 16, wherein said first logic circuit further receives a data output enable signal, said first logic circuit activates the first control signal when both the data output enable signal commands the output of data and the sixth control signal commands the active state regardless of state of the first and second bank activation signals, and inactivates the first control signal when the sixth control signal commands the inactive state regardless of the state of the first and second bank activation signals and the data output enable signal.

* * * * *